US012160252B2

(12) United States Patent
Wu et al.

(10) Patent No.: US 12,160,252 B2
(45) Date of Patent: Dec. 3, 2024

(54) CONSTRUCTING METHOD, PROCESSING DEVICE, STORAGE MEDIUM AND CODING METHOD

(71) Applicants: Beijing ESWIN Computing Technology Co., Ltd., Beijing (CN); Guangzhou Transa Semi Information Technology Co., Ltd., Guangdong Province (CN)

(72) Inventors: Yanqi Wu, Beijing (CN); Yanzhong Dai, Beijing (CN); Sujiang Rong, Beijing (CN)

(73) Assignees: Beijing ESWIN Computing Technology Co., Ltd., Beijing (CN); Guangzhou Transa Semi Information Technology Co., Ltd., Guangdong (CN)

( * ) Notice: Subject to any disclaimer, the term of this patent is extended or adjusted under 35 U.S.C. 154(b) by 0 days.

(21) Appl. No.: 18/168,888

(22) Filed: Feb. 14, 2023

(65) Prior Publication Data

US 2024/0007129 A1 Jan. 4, 2024

(30) Foreign Application Priority Data

Jun. 30, 2022 (CN) ........................ 202210778987.4

(51) Int. Cl.
*H03M 13/11* (2006.01)
*G06F 17/16* (2006.01)
*H03M 13/00* (2006.01)

(52) U.S. Cl.
CPC .......... *H03M 13/116* (2013.01); *G06F 17/16* (2013.01); *H03M 13/616* (2013.01)

(58) Field of Classification Search
None
See application file for complete search history.

(56) References Cited

U.S. PATENT DOCUMENTS 11,133,826 B2 * 9/2021 Li ........................ H03M 13/036
11,296,726 B2 4/2022 Jin et al.
(Continued)

FOREIGN PATENT DOCUMENTS

WO 2019128809 A1 7/2019

OTHER PUBLICATIONS

R. Asvadi, A. H. Banihashemi and M. Ahmadian-Attari, "Lowering the Error Floor of LDPC Codes Using Cyclic Liftings," in IEEE Transactions on Information Theory, vol. 57, No. 4, pp. 2213-2224, Apr. 2011, (Year: 2011).*

D. G. M. Mitchell, R. Smarandache and D. J. Costello, "Quasi-cyclic LDPC codes based on pre-lifted protographs," 2011 IEEE Information Theory Workshop, Paraty, Brazil, 2011, pp. 350-354, (Year: 2011).*

(Continued)

*Primary Examiner* — Daniel F. McMahon
(74) *Attorney, Agent, or Firm* — Leason Ellis LLP

(57) ABSTRACT

There are provided a method for constructing a permutation matrix or a check matrix, a processing device, a storage medium and a coding method. The method of constructing a permutation matrix includes: obtaining a base matrix used for the permutation matrix; and lifting the base matrix to obtain the permutation matrix, which includes: obtaining a protograph of the base matrix; and obtaining each macro-cycle in the protograph, and for each macro-cycle in the protograph, determining a size of a short cycle corresponding to the macro-cycle in a Tanner graph of the check matrix corresponding to the permutation matrix by an equivalent cyclic value ECS of the macro-cycle, and determining whether at least one cyclic value in the macro-cycle needs to be set according to the size of the short cycle.

17 Claims, 10 Drawing Sheets

(56) References Cited

U.S. PATENT DOCUMENTS

2010/0251065 A1 9/2010 Livshitz
2012/0084625 A1* 4/2012 Pisek .................. H03M 13/116 714/757
2012/0240001 A1* 9/2012 Abu-Surra .......... H03M 13/618 714/752
2015/0117433 A1 4/2015 Zhang et al.
2016/0156750 A1 6/2016 Zhang et al.
2016/0173132 A1* 6/2016 Cho .................. H03M 13/1154 714/752
2018/0246783 A1* 8/2018 Avraham .............. H03M 13/27
2020/0220556 A1* 7/2020 Usatyuk ............. H03M 13/1188
2021/0013901 A1 1/2021 Li et al.
2022/0278698 A1* 9/2022 Koike-Akino ........ H03M 13/13
2024/0007129 A1 1/2024 Wu et al.
2024/0007130 A1 1/2024 Wu et al.

OTHER PUBLICATIONS

Lau et al. "Random-permutation-matrix-based cyclically-coupled LDPC codes." 2017 19th International Conference on Advanced Communication Technology (ICACT). IEEE, 2017. 4 pages.

Office Action for corresponding U.S. Appl. No. 18/169,482 dated Mar. 28, 2024. 13 pages.

Zhang et al. "Deterministic Girth-Eight QC-LDPC Codes with Large Column Weight." IEEE Communications Letters 18.4 (2014): 656-659. 7 pages.

Office Action cited in corresponding U.S. Appl. No. 18/170,725 dated Jul. 2, 2024. 14 pages.

Office Action cited in corresponding U.S. Appl. No. 18/170,725 dated Sep. 6, 2024. 10 pages.

* cited by examiner $$
\left[\begin{array}{cccccccccccccccccccccccc}
x & x & x & x & 1 & 0 & \sim & \sim & \sim & \sim & \sim & \sim & \sim & \sim & \sim & \sim & \sim & \sim & \sim & \sim & \sim & \sim & \sim & \sim \\
x & x & x & x & \sim & 0 & 0 & \sim & \sim & \sim & \sim & \sim & \sim & \sim & \sim & \sim & \sim & \sim & \sim & \sim & \sim & \sim & \sim & \sim \\
x & x & x & x & \sim & \sim & 0 & 0 & \sim & \sim & \sim & \sim & \sim & \sim & \sim & \sim & \sim & \sim & \sim & \sim & \sim & \sim & \sim & \sim \\
x & x & x & x & \sim & \sim & \sim & 0 & 0 & \sim & \sim & \sim & \sim & \sim & \sim & \sim & \sim & \sim & \sim & \sim & \sim & \sim & \sim & \sim \\
x & x & x & x & \sim & \sim & \sim & \sim & 0 & 0 & \sim & \sim & \sim & \sim & \sim & \sim & \sim & \sim & \sim & \sim & \sim & \sim & \sim & \sim \\
x & x & x & x & \sim & \sim & \sim & \sim & \sim & 0 & 0 & \sim & \sim & \sim & \sim & \sim & \sim & \sim & \sim & \sim & \sim & \sim & \sim & \sim \\
x & x & x & x & \sim & \sim & \sim & \sim & \sim & \sim & 0 & 0 & \sim & \sim & \sim & \sim & \sim & \sim & \sim & \sim & \sim & \sim & \sim & \sim \\
x & x & x & x & \sim & \sim & \sim & \sim & \sim & \sim & \sim & 0 & 0 & \sim & \sim & \sim & \sim & \sim & \sim & \sim & \sim & \sim & \sim & \sim \\
x & x & x & x & \sim & \sim & \sim & \sim & \sim & \sim & \sim & \sim & 0 & 0 & \sim & \sim & \sim & \sim & \sim & \sim & \sim & \sim & \sim & \sim \\
x & x & x & x & \sim & \sim & \sim & \sim & \sim & \sim & \sim & \sim & \sim & 0 & 0 & \sim & \sim & \sim & \sim & \sim & \sim & \sim & \sim & \sim \\
x & x & x & x & 0 & \sim & \sim & \sim & \sim & \sim & \sim & \sim & \sim & \sim & 0 & 0 & \sim & \sim & \sim & \sim & \sim & \sim & \sim & \sim \\
x & x & x & x & \sim & \sim & \sim & \sim & \sim & \sim & \sim & \sim & \sim & \sim & \sim & 0 & 0 & \sim & \sim & \sim & \sim & \sim & \sim & \sim \\
x & x & x & x & \sim & \sim & \sim & \sim & \sim & \sim & \sim & \sim & \sim & \sim & \sim & \sim & 0 & 0 & \sim & \sim & \sim & \sim & \sim & \sim \\
x & x & x & x & \sim & \sim & \sim & \sim & \sim & \sim & \sim & \sim & \sim & \sim & \sim & \sim & \sim & 0 & 0 & \sim & \sim & \sim & \sim & \sim \\
x & x & x & x & \sim & \sim & \sim & \sim & \sim & \sim & \sim & \sim & \sim & \sim & \sim & \sim & \sim & \sim & 0 & 0 & \sim & \sim & \sim & \sim \\
x & x & x & x & \sim & \sim & \sim & \sim & \sim & \sim & \sim & \sim & \sim & \sim & \sim & \sim & \sim & \sim & \sim & 0 & 0 & \sim & \sim & \sim \\
x & x & x & x & \sim & \sim & \sim & \sim & \sim & \sim & \sim & \sim & \sim & \sim & \sim & \sim & \sim & \sim & \sim & \sim & 0 & 0 & \sim & \sim \\
x & x & x & x & \sim & \sim & \sim & \sim & \sim & \sim & \sim & \sim & \sim & \sim & \sim & \sim & \sim & \sim & \sim & \sim & \sim & 0 & 0 & \sim \\
x & x & x & x & \sim & \sim & \sim & \sim & \sim & \sim & \sim & \sim & \sim & \sim & \sim & \sim & \sim & \sim & \sim & \sim & \sim & \sim & 0 & 0 \\
x & x & x & x & 1 & \sim & \sim & \sim & \sim & \sim & \sim & \sim & \sim & \sim & \sim & \sim & \sim & \sim & \sim & \sim & \sim & \sim & \sim & 0
\end{array}\right]
$$

FIG. 6A $$
\left[\begin{array}{cccccccccccccccccccccccc}
x & x & x & x & x & x & 1 & 0 & \sim & \sim & \sim & \sim & \sim & \sim & \sim & \sim & \sim & \sim & \sim & \sim & \sim & \sim & \sim & \sim \\
x & x & x & x & x & x & \sim & 0 & 0 & \sim & \sim & \sim & \sim & \sim & \sim & \sim & \sim & \sim & \sim & \sim & \sim & \sim & \sim & \sim \\
x & x & x & x & x & x & \sim & \sim & 0 & 0 & \sim & \sim & \sim & \sim & \sim & \sim & \sim & \sim & \sim & \sim & \sim & \sim & \sim & \sim \\
x & x & x & x & x & x & \sim & \sim & \sim & 0 & 0 & \sim & \sim & \sim & \sim & \sim & \sim & \sim & \sim & \sim & \sim & \sim & \sim & \sim \\
x & x & x & x & x & x & \sim & \sim & \sim & \sim & 0 & 0 & \sim & \sim & \sim & \sim & \sim & \sim & \sim & \sim & \sim & \sim & \sim & \sim \\
x & x & x & x & x & x & \sim & \sim & \sim & \sim & \sim & 0 & 0 & \sim & \sim & \sim & \sim & \sim & \sim & \sim & \sim & \sim & \sim & \sim \\
x & x & x & x & x & x & \sim & \sim & \sim & \sim & \sim & \sim & 0 & 0 & \sim & \sim & \sim & \sim & \sim & \sim & \sim & \sim & \sim & \sim \\
x & x & x & x & x & x & \sim & \sim & \sim & \sim & \sim & \sim & \sim & 0 & 0 & \sim & \sim & \sim & \sim & \sim & \sim & \sim & \sim & \sim \\
x & x & x & x & x & x & \sim & \sim & \sim & \sim & \sim & \sim & \sim & \sim & 0 & 0 & \sim & \sim & \sim & \sim & \sim & \sim & \sim & \sim \\
x & x & x & x & x & x & 0 & \sim & \sim & \sim & \sim & \sim & \sim & \sim & \sim & 0 & 0 & \sim & \sim & \sim & \sim & \sim & \sim & \sim \\
x & x & x & x & x & x & \sim & \sim & \sim & \sim & \sim & \sim & \sim & \sim & \sim & \sim & 0 & 0 & \sim & \sim & \sim & \sim & \sim & \sim \\
x & x & x & x & x & x & \sim & \sim & \sim & \sim & \sim & \sim & \sim & \sim & \sim & \sim & \sim & 0 & 0 & \sim & \sim & \sim & \sim & \sim \\
x & x & x & x & x & x & \sim & \sim & \sim & \sim & \sim & \sim & \sim & \sim & \sim & \sim & \sim & \sim & 0 & 0 & \sim & \sim & \sim & \sim \\
x & x & x & x & x & x & \sim & \sim & \sim & \sim & \sim & \sim & \sim & \sim & \sim & \sim & \sim & \sim & \sim & 0 & 0 & \sim & \sim & \sim \\
x & x & x & x & x & x & \sim & \sim & \sim & \sim & \sim & \sim & \sim & \sim & \sim & \sim & \sim & \sim & \sim & \sim & 0 & 0 & \sim & \sim \\
x & x & x & x & x & x & \sim & \sim & \sim & \sim & \sim & \sim & \sim & \sim & \sim & \sim & \sim & \sim & \sim & \sim & \sim & 0 & 0 & \sim \\
x & x & x & x & x & x & \sim & \sim & \sim & \sim & \sim & \sim & \sim & \sim & \sim & \sim & \sim & \sim & \sim & \sim & \sim & \sim & 0 & 0 \\
x & x & x & x & x & x & 1 & \sim & \sim & \sim & \sim & \sim & \sim & \sim & \sim & \sim & \sim & \sim & \sim & \sim & \sim & \sim & \sim & 0
\end{array}\right]
$$

FIG. 6B $$
\begin{bmatrix}
x & x & x & x & x & x & x & x & 1 & 0 & \sim & \sim & \sim & \sim & \sim & \sim & \sim & \sim & \sim & \sim & \sim & \sim & \sim & \sim \\
x & x & x & x & x & x & x & x & \sim & 0 & 0 & \sim & \sim & \sim & \sim & \sim & \sim & \sim & \sim & \sim & \sim & \sim & \sim & \sim \\
x & x & x & x & x & x & x & x & \sim & \sim & 0 & 0 & \sim & \sim & \sim & \sim & \sim & \sim & \sim & \sim & \sim & \sim & \sim & \sim \\
x & x & x & x & x & x & x & x & \sim & \sim & \sim & 0 & 0 & \sim & \sim & \sim & \sim & \sim & \sim & \sim & \sim & \sim & \sim & \sim \\
x & x & x & x & x & x & x & x & \sim & \sim & \sim & \sim & 0 & 0 & \sim & \sim & \sim & \sim & \sim & \sim & \sim & \sim & \sim & \sim \\
x & x & x & x & x & x & x & x & \sim & \sim & \sim & \sim & \sim & 0 & 0 & \sim & \sim & \sim & \sim & \sim & \sim & \sim & \sim & \sim \\
x & x & x & x & x & x & x & x & \sim & \sim & \sim & \sim & \sim & \sim & 0 & 0 & \sim & \sim & \sim & \sim & \sim & \sim & \sim & \sim \\
x & x & x & x & x & x & x & x & \sim & \sim & \sim & \sim & \sim & \sim & \sim & 0 & 0 & \sim & \sim & \sim & \sim & \sim & \sim & \sim \\
x & x & x & x & x & x & x & x & 0 & \sim & \sim & \sim & \sim & \sim & \sim & \sim & 0 & 0 & \sim & \sim & \sim & \sim & \sim & \sim \\
x & x & x & x & x & x & x & x & \sim & \sim & \sim & \sim & \sim & \sim & \sim & \sim & \sim & 0 & 0 & \sim & \sim & \sim & \sim & \sim \\
x & x & x & x & x & x & x & x & \sim & \sim & \sim & \sim & \sim & \sim & \sim & \sim & \sim & \sim & 0 & 0 & \sim & \sim & \sim & \sim \\
x & x & x & x & x & x & x & x & \sim & \sim & \sim & \sim & \sim & \sim & \sim & \sim & \sim & \sim & \sim & 0 & 0 & \sim & \sim & \sim \\
x & x & x & x & x & x & x & x & \sim & \sim & \sim & \sim & \sim & \sim & \sim & \sim & \sim & \sim & \sim & \sim & 0 & 0 & \sim & \sim \\
x & x & x & x & x & x & x & x & \sim & \sim & \sim & \sim & \sim & \sim & \sim & \sim & \sim & \sim & \sim & \sim & \sim & 0 & 0 & \sim \\
x & x & x & x & x & x & x & x & \sim & \sim & \sim & \sim & \sim & \sim & \sim & \sim & \sim & \sim & \sim & \sim & \sim & \sim & 0 & 0 \\
x & x & x & x & x & x & x & x & 1 & \sim & \sim & \sim & \sim & \sim & \sim & \sim & \sim & \sim & \sim & \sim & \sim & \sim & \sim & 0
\end{bmatrix}
$$

FIG. 6C

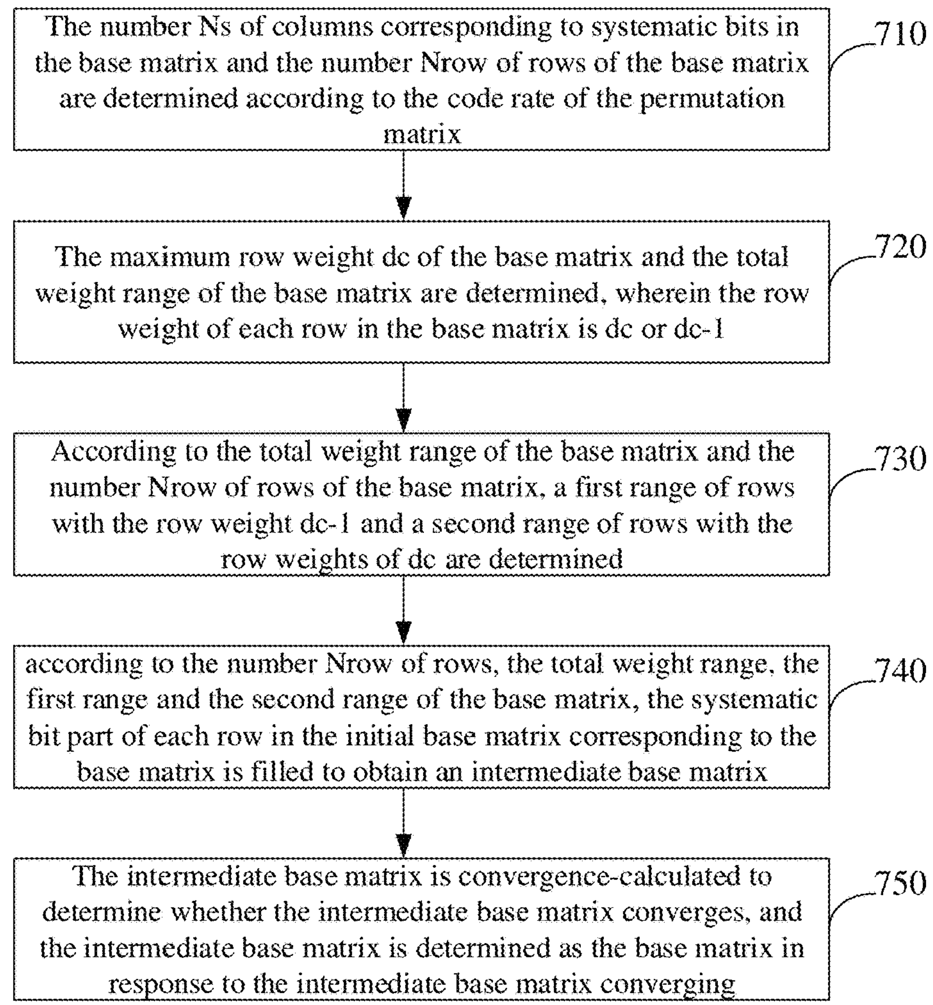

Processing Unit
610

620

Computer
Program Module
621

CONSTRUCTING METHOD, PROCESSING DEVICE, STORAGE MEDIUM AND CODING METHOD

CROSS REFERENCES TO RELATED APPLICATIONS

The present application claims the priority of the Chinese patent application No. 202210778987.4 filed on Jun. 30, 2022, for all purposes, the disclosure of which is incorporated herein by reference in its entirety as part of the present application.

TECHNICAL FIELD

The disclosed embodiments relate to a method for constructing a permutation matrix or a check matrix, a processing device, a storage medium and a coding method.

BACKGROUND

In the communication system, in order to counter interference caused by a channel and improve reliability of information transmission, a forward error correction code (FEC) technology is often adopted, i.e., redundancy degree of information is increased at a sending end, and a receiving end uses the redundancy information for error correction.

As shown in FIG. 1, a typical encoding and decoding process includes information source, information source-encoding, channel-encoding, modulation, channel, demodulation, channel-decoding, information source-decoding and information sink, among which a forward error correction technology can be used in channel encoding and decoding. At present, channel encoding and decoding technologies mainly include block codes, convolutional codes, Turbo codes, LDPC codes, etc.

The basic principle of channel encoding and decoding is described by taking binary coding as an example. As shown in FIG. 2, some redundant bit sequences p are added to the end of an information bit sequence u to obtain a code word sequence c=[u, p]. Then, the code word sequence is modulated and sent to the channel. At the receiving end, the received redundant information p is used to perform error correction and error detection on the information bit sequence part u. This error correction and error detection operation is called decoding.

LDPC codes are widely used in various communication systems, such as 5G NR (air interface standard of the fifth generation mobile communication network), WiFi (Wireless Fidelity), DVB (Digital Video Broadcasting) or optical communication systems, because of their performance close to Shannon limit and high throughput brought by parallel decoding.

SUMMARY

At least one embodiment of the present disclosure provides a method of constructing a permutation matrix for QC-LDPC codes, comprising: obtaining a base matrix used for the permutation matrix; and lifting the base matrix to obtain the permutation matrix, which comprises: obtaining a protograph of the base matrix; and obtaining each macro-cycle in the protograph, and for each macro-cycle in the protograph, determining a size of a short cycle corresponding to the macro-cycle in a Tanner graph of the check matrix corresponding to the permutation matrix by an equivalent cyclic value ECS of the macro-cycle, and determining whether at least one cyclic value in the macro-cycle needs to be set according to the size of the short cycle.

At least one embodiment of the present disclosure provides a method of constructing a check matrix of QC-LDPC codes, comprising: obtaining the permutation matrix according to the method as above; and obtaining the check matrix from the permutation matrix.

At least one embodiment of the present disclosure provides a processing device, comprising: a processing unit; and a memory, on which one or more computer program modules are stored; wherein when the one or more computer program modules are configured to be executed by the processing unit, the method as claimed in any one of claims 1-16 or the method as above.

At least one embodiment of the present disclosure provides a non-transitory readable storage medium, on which computer instructions are stored, wherein the computer instructions, when executed by a processor, implement the method as claimed in any one of claims 1-16 or the method as above.

At least one embodiment of the present disclosure provides a coding method, comprising: channel-encoding or channel-decoding a code stream using a check matrix of QC-LDPC codes obtained by using the method as above.

BRIEF DESCRIPTION OF THE DRAWINGS

In order to more clearly illustrate the technical solution of the embodiment of the present disclosure, the drawings of the embodiment will be briefly introduced below, and it is clear that the drawings described below refer only to some embodiments of the present disclosure, not to the limitations of the present disclosure.

FIG. 6A, FIG. 6B and FIG. 6C are the permutation matrix forms of 1/6, 1/4 and 1/3 bit rates, respectively;

FIG. 7 is a schematic diagram of a method for constructing a base matrix for QC-LDPC code according to an embodiment of the present disclosure;

DETAILED DESCRIPTION

Figure 1:
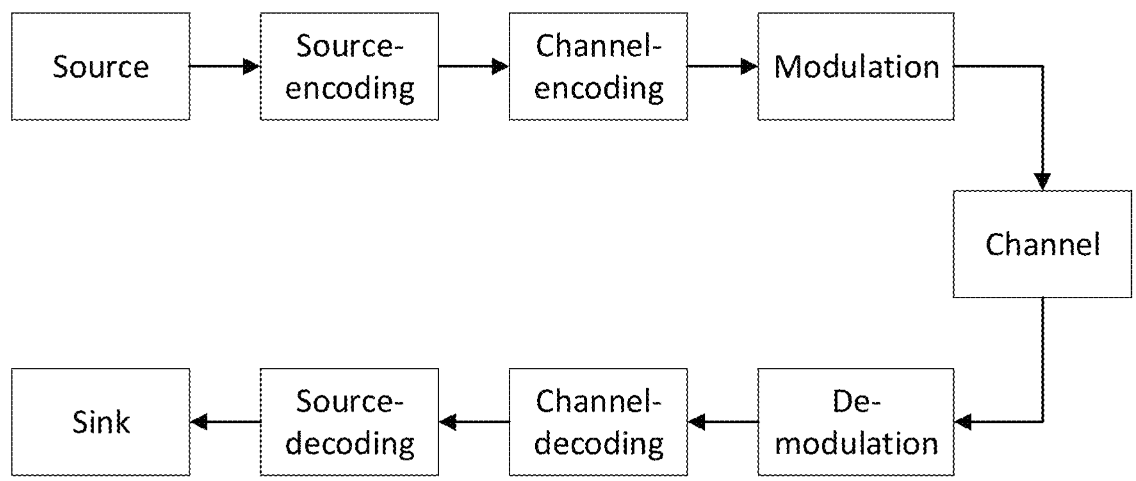
FIG. 1 shows a schematic diagram of an exemplary encoding and decoding process.
Figure 2:
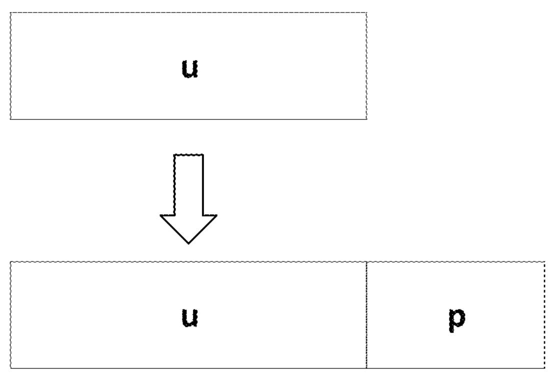
FIG. 2 is a schematic diagram of the codeword sequence C obtained by the information bit sequence u and the redundant bit sequence p.

In order to make the purpose, technical scheme and advantages of the embodiments of the present disclosure clearer, the technical scheme of the embodiments of the present disclosure will be clearly and completely described below with reference to the drawings of the embodiments of the present disclosure. Obviously, the described embodiments are part of the embodiments of this disclosure, but not all of them. Based on the described embodiments of this disclosure, all other embodiments obtained by ordinary technicians in this field without creative labor are within the protection scope of this disclosure.

Unless otherwise defined, the technical terms or scientific terms used here shall have ordinary meanings as understood by those with ordinary skills in the field to which this disclosure belongs. The words "first", "second" and the like used in this disclosure do not indicate any order, quantity or importance, but are only used to distinguish different components. Similarly, similar words such as "including" or "comprising" mean that the elements or objects before this word cover the elements or objects listed after this word and their equivalents, without excluding other elements or objects. Words like "connected" or "connecting" are not limited to physical or mechanical connections, but may include electrical connections, whether direct or indirect. "Up", "down", "left" and "right" are only used to express a relative positional relationship. When an absolute position of the described object changes, the relative positional relationship may also be changed accordingly.

The LDPC code is essentially a linear block code, but a proportion of "1" in the check matrix is relatively low. Each LDPC code can be identified by a generating matrix G, and the code word can be generated by a product of information bits and the generating matrix, i.e., c=u*G. On the other hand, LDPC codes may be represented by the check matrix H instead of the generating matrix G, and the relationship between the check matrix and the generating matrix is: $G*H^T=0$. Assume that the check matrix can be written as: $H=[H_u, H_p]$, where $H_u$ corresponds to the information bit in the check matrix and $H_p$ corresponds to a check bit in the check matrix. Then, the generating matrix can be written as $G=[I\ H_u^T H_p^{-T}]$.

A number of is in a certain row in the check matrix is called a row weight of this row, and correspondingly, the number of is in a certain column is called a column weight of this column. If all rows have the same row weight and all columns have the same column weight, this LDPC code is called a regular code, otherwise it is an irregular code. The LDPC codes may also be analyzed by distribution of row weight and column weight, wherein $d_v$ represents the number of column weights, $d_c$ represents the number of row weights, $\lambda_d$ represents a proportion of column weight d among $d_v$ column weights, $\rho_d$ represents the proportion of column weight d among $d_e$ column weights, then the distribution of column weights and row weights can be expressed by the following formula:

$$\lambda(X)=\sum_{d=1}^{d_v}\lambda_d X^{d-1},\ \rho(X)=\sum_{d=1}^{d_c}\rho_d X^{d-1}.$$

In a density evolution theory, the column weight and row weight determine the performance of the LDPC code.

Another representation of the LDPC code is a Tanner graph, which is a bipartite graph. Take the code represented by the following simple check matrix H as an example:

$$H=\begin{bmatrix}1&1&1&1&0&0&0&0&0&0\\1&0&0&0&1&1&1&0&0&0\\0&1&0&0&1&0&0&1&1&0\\0&0&1&0&0&1&0&1&0&1\\0&0&0&1&0&0&1&0&1&1\end{bmatrix}$$

Figure 3:
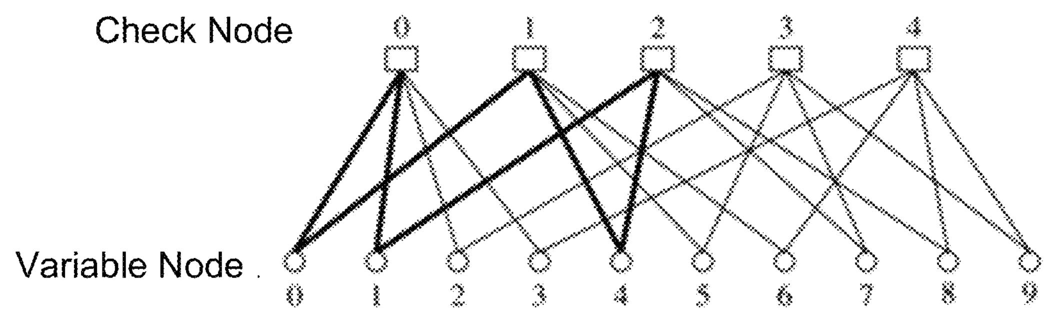
FIG. 3 is a schematic diagram of a Tanner graph of an exemplary check matrix.

Its corresponding Tanner graph is shown in FIG. 3. In the Tanner graph, the nodes corresponding to the rows of the matrix H are called check nodes, and the nodes corresponding to the columns of the matrix H are called variable nodes. If the value corresponding to an intersection of a row and a column in the matrix H is 1, there is a connecting line in the graph, and this connecting line is called an edge. In the Tanner graph shown in FIG. 3, there are 10 variable nodes and 5 check nodes.

The Tanner graph is very helpful for studying the LDPC codes, such as the cycles and the perimeters in the Tanner graph. The cycle in the Tanner graph refers to a cycle formed by lines that start from a node S, go along the connecting line, and return to this node S. The size of the cycle is the number of lines or edges. The bold connecting lines in FIG. 3 form a cycle. The perimeter of the Tanner graph refers to the size of the smallest cycle. In addition, there is a concept of an external information freedom degree in the Tanner graph, and the number of check nodes with only one edge connected to a cycle is called the external information freedom degree.

Structured LDPC codes are also called (Quasi-Cyclic) LDPC codes (QC-LDPC codes), whose structure is easy for parallel processing of hardware and can achieve high throughput, so it is adopted in many systems. The following matrix P is a permutation matrix of QC-LDPC codes, and each value in the matrix represents a submatrix of Z*Z, wherein Z is called a lifting factor.

$$P=\begin{bmatrix}1&-1&7&0&2\\2&5&-1&4&7\\-1&-1&6&-1&3\end{bmatrix}$$

When the value in the matrix P is −1, it means that it is a Z*Z all-zero matrix. The other value x represents a matrix obtained by cycle-shifting a unit matrix of Z*Z to the right by x, referring to the following example. The real check matrix is an expansion of P. Taking Z=8 as an example, the following cyclic matrix can be obtained.

$$P_1=\begin{bmatrix}0&1&0&0&0&0&0&0\\0&0&1&0&0&0&0&0\\0&0&0&1&0&0&0&0\\0&0&0&0&1&0&0&0\\0&0&0&0&0&1&0&0\\0&0&0&0&0&0&1&0\\0&0&0&0&0&0&0&1\\1&0&0&0&0&0&0&0\end{bmatrix},\ P_5=\begin{bmatrix}0&0&0&0&0&1&0&0\\0&0&0&0&0&0&1&0\\0&0&0&0&0&0&0&1\\1&0&0&0&0&0&0&0\\0&1&0&0&0&0&0&0\\0&0&1&0&0&0&0&0\\0&0&0&1&0&0&0&0\\0&0&0&0&1&0&0&0\end{bmatrix}.$$

The base matrix corresponding to the permutation matrix is defined as: the elements greater than or equal to zero in the permutation matrix are 1s, and the others are 0s, i.e., the following B matrix is the base matrix of the above permutation matrix:

$$B=\begin{bmatrix}1&0&1&1&1\\1&1&0&1&1\\0&0&1&0&1\end{bmatrix}$$

Figure 4:
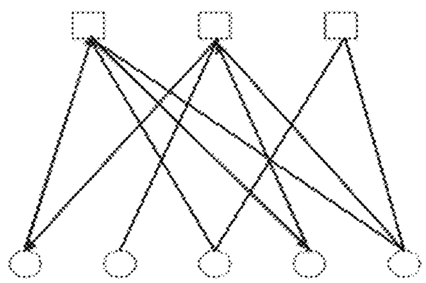
FIG. 4 is a schematic diagram of the protograph of an exemplary base matrix.

When designing the QC-LDPC codes, the base matrix may be designed first, and then the base matrix may be upgraded (i.e., the cyclic value of the position of 1 in the base matrix may be determined) to obtain the permutation matrix. The Tanner graph based on the base matrix is called protograph. For example, the protograph of the above B matrix is shown in FIG. 4.

Figure 5A:
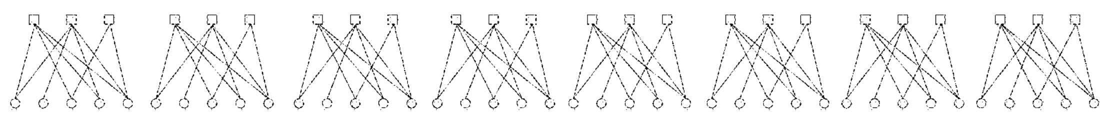
FIG. 5A is a schematic diagram of a Tanner graph of a permutation matrix.

The lifting of the base matrix is replacement of the protograph. In this process, the protograph is responsible for Z (lifting factor), wherein Z is a positive integer. For example, take Z=8 as an example. First, 8 copies of the above protograph are made, and the following Tanner graph as shown in FIG. 5A is obtained. Take P(1,1)=1 as an example $$P_1=\begin{bmatrix}0&1&0&0&0&0&0&0\\0&0&1&0&0&0&0&0\\0&0&0&1&0&0&0&0\\0&0&0&0&1&0&0&0\\0&0&0&0&0&1&0&0\\0&0&0&0&0&0&1&0\\0&0&0&0&0&0&0&1\\1&0&0&0&0&0&0&0\end{bmatrix}$$

Figure 5B:
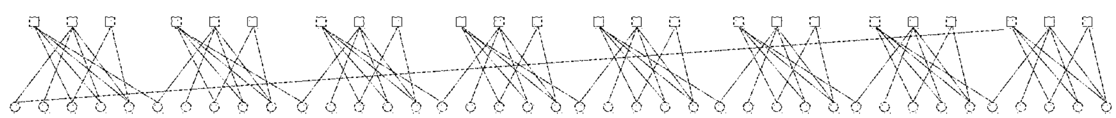
FIG. 5B is a schematic diagram of the interleaving and permutating of the protograph.

This represents the matrix obtained by cyclically shifting one bit to the right, so the protograph is interleaved and permuted to obtain the Tanner graph as shown in FIG. 5B. In the same way, by interleaving and permuting all the elements greater than or equal to 0 in the base matrix, the Tanner graph of the corresponding check matrix can be obtained.

The best decoder of Turbo codes and LDPC codes adopts an iterative decoding method. The iterative decoder transfers messages in the iterative process, and probability density of the transferred messages is constantly changing in the iterative process. The probability density evolution (DE) theory is based on this principle to predict the performance of an LDPC code. Specifically, the probability density evolution theory calculates the probability density of messages according to the distribution of row weights and column weights. A density evolution tool can be used to determine optimal distribution of row weights and column weights when constructing LDPC codes, taking the following distribution of column weights and row weight as an example:

$$\lambda(X)=\sum_{d=1}^{d_v}\lambda_d X^{d-1},\ \rho(X)=\sum_{d=1}^{d_c}\rho_d X^{d-1}$$

Assuming that the probability of the information transferred by the check node to the variable node is $p^{(c)}$ and the probability of the information transferred by the variable node to the check node is $p^{(v)}$, the probability change relationship between the variable node and the check node is as follows, wherein 1 is a number of iterations, and a function $\Gamma^{-1}(x)$ is the probability change introduced by the operation of $\phi^{-1}(x)$ function in the decoding calculation.

$$\begin{aligned}p_\ell^{(v)}&=p_0^{(c)}*\sum_{d=1}^{d_v}\lambda_d\cdot\left(p_{\ell-1}^{(c)}\right)^{*(d-1)}\\&=p_0^{(c)}*\lambda_s\left(p_{\ell-1}^{(c)}\right)\end{aligned},$$

The QC-LDPC codes generated based on the base matrix can be obtained by performing calculation on the base matrix by using the density evolution method. For example, the density evolution method may use a protograph extrinsic-information-transfer (PEXIT) algorithm to perform calculation on the base matrix and get the probability of the transferred information. For example, the steps of the algorithm are as follows:

(1) Initialization: Select an $E_b/N_o$ and initialize $\sigma_{ch}=(\sigma_{ch,o}, \ldots, \sigma_{ch,N-1})$, wherein $\sigma_{ch,J}^2=8*R*E_b/N_e$, $R$ is the code rate.

(2) Variable node to check node: $b_{ij}$ is a number of edges between variable node j and check node i, when c=i, $\delta_{ci}=1$; otherwise $\delta_{ci}=0$ $$I_{E,V}^{j\to i}=J\left(\sqrt{\sum_{c=1}^{M}(b_{cj}-\delta_{ci})\left(J^{-1}\left(I_{E,C}^{c\to j}\right)\right)^2+\sigma_{ch,j}^2}\right)$$

(3) Check node to variable node: when v=j, $\delta_{vj}=1$; otherwise $\delta_{vj}=0$ $$I_{E,C}^{i\to j}=1-J\left(\sqrt{\sum_{v=1}^{N}(b_{iv}-\delta_{vj})\left(J^{-1}\left(1-I_{E,V}^{v\to i}\right)\right)^2}\right)$$

(4) Cumulative mutual information calculation:

$$I_{CMI}^{j}=J\left(\sqrt{\sum_{c=1}^{M}\left(J^{-1}\left(I_{E,C}^{c\to j}\right)\right)^2+\sigma_{ch,j}^2}\right)$$

(5) Stop iteration criterion. If $I_{CMI}^{J}$ is close to 1, then stop. Otherwise, turn to step (2) to continue the iteration.

In the above steps, the function J(x) is:

$$J(\sigma_{ch})=1-\int_{-\infty}^{\infty}\frac{e^{-(\xi-\sigma_{ch}^2/2)^2/2\sigma_{ch}^2}}{\sqrt{2\pi\sigma_{ch}^2}}\cdot\log_2\left[1+e^{-\xi}\right]d\xi$$

$J(x)$ and $J^{-1}(x)$ can be calculated by the following simplified algorithm:

$$J(\sigma) \approx \begin{cases} a_{J,1}\sigma^3 + b_{J,1}\sigma^2 + c_{J,1}\sigma, & 0 \le \sigma \le \sigma^* \\ 1 - e^{a_{J,2}\sigma^3 + b_{J,2}\sigma^2 + c_{J,2}\sigma + d_{J,2}}, & \sigma^* < \sigma < 10 \\ 1, & \sigma \ge 10 \end{cases}$$

$$\begin{aligned} &a_{J,1} = -0.0421061, \quad b_{J,1} = 0.209252 \\ &c_{J,1} = -0.00640081 \\ &a_{J,2} = 0.00181491, \quad b_{J,2} = -0.142675 \\ &c_{J,2} = -0.0822054, \quad d_{J,2} = 0.0549608 \end{aligned}.$$

$$J^{-1}(I) \approx \begin{cases} a_{\sigma,1}I^2 + b_{\sigma,1}I + c_{\sigma,1}\sqrt{I}, & 0 \le I \le I^* \\ -a_{\sigma,2}\ln[b_{\sigma,2}(1-I)] - c_{\sigma,2}I, & I^* < I < 1 \end{cases},$$

$$\begin{aligned} &a_{\sigma,1} = 1.09542, \quad b_{\sigma,1} = 0.214217, \quad c_{\sigma,1} = 2.33727 \\ &a_{\sigma,2} = 0.706692, \quad b_{\sigma,2} = 0.386013, \quad c_{\sigma,2} = -1.75017 \end{aligned}.$$

As a wireless LAN technology, WiFi is popular all over the world because of its convenience and low price. Structured QC-LDPC codes are introduced into the 802.11n standard of WiFi to improve the throughput of WiFi network. However, QC-LDPC of 802.11n standard has only 1/2, 2/3, 3/4, 5/6 code rates, and lacks LDPC codes of low code rates. The QC-LDPC of WiFi adopts an Irregular Repeat-Accumulate structure. The LDPC codes with this structure is easy to implement in hardware while ensuring that the performance meets the requirements.

Taking the 1/2 code rate as an example, as shown in the following permutation matrix, the size of the permutation matrix is 12*24, and the lifting factor Z=27/54/81, wherein within the dotted row is a part corresponding to the check bits, the size of which part is 12*12, and this part has a fixed structure, and this structure is easy for implementing the encoder. The part outside the red dotted box in front is the part that needs to be designed. The row weights of each row of the base matrix of the QC-LDPC with different code rates of the 802.11n standard of WiFi are at most 1, and the total number of is in the base matrix is between 79 and 88. Taking the 1/2 code rate as an example, the row weights of respective rows in the base matrix are two values of {7,8}, and the total weight of the base matrix is 88.

$$\left[\begin{array}{cccccccccccc|cccccccccccc}
0 & \cdot & \cdot & \cdot & 0 & 0 & \cdot & \cdot & 0 & \cdot & \cdot & 0 & 1 & 0 & \cdot & \cdot & \cdot & \cdot & \cdot & \cdot & \cdot & \cdot & \cdot & \cdot \\
22 & 0 & \cdot & \cdot & 17 & \cdot & 0 & 0 & 12 & \cdot & \cdot & \cdot & \cdot & 0 & 0 & \cdot & \cdot & \cdot & \cdot & \cdot & \cdot & \cdot & \cdot & \cdot \\
6 & \cdot & 0 & \cdot & 10 & \cdot & \cdot & \cdot & 24 & \cdot & 0 & \cdot & \cdot & \cdot & 0 & 0 & \cdot & \cdot & \cdot & \cdot & \cdot & \cdot & \cdot & \cdot \\
2 & \cdot & \cdot & 0 & 20 & \cdot & \cdot & \cdot & 25 & 0 & \cdot & \cdot & \cdot & \cdot & \cdot & 0 & 0 & \cdot & \cdot & \cdot & \cdot & \cdot & \cdot & \cdot \\
23 & \cdot & \cdot & \cdot & 3 & \cdot & \cdot & \cdot & 0 & \cdot & 9 & 11 & \cdot & \cdot & \cdot & \cdot & 0 & 0 & \cdot & \cdot & \cdot & \cdot & \cdot & \cdot \\
24 & \cdot & 23 & 1 & 17 & \cdot & 3 & \cdot & 10 & \cdot & \cdot & \cdot & \cdot & \cdot & \cdot & \cdot & \cdot & 0 & 0 & \cdot & \cdot & \cdot & \cdot & \cdot \\
25 & \cdot & \cdot & \cdot & 8 & \cdot & \cdot & \cdot & 7 & 13 & \cdot & \cdot & 0 & \cdot & \cdot & \cdot & \cdot & \cdot & 0 & 0 & \cdot & \cdot & \cdot & \cdot \\
13 & 24 & \cdot & \cdot & 0 & \cdot & 8 & \cdot & 5 & \cdot & \cdot & \cdot & \cdot & \cdot & \cdot & \cdot & \cdot & \cdot & \cdot & 0 & 0 & \cdot & \cdot & \cdot \\
7 & 20 & \cdot & 16 & 22 & 10 & \cdot & \cdot & 23 & \cdot & \cdot & \cdot & \cdot & \cdot & \cdot & \cdot & \cdot & \cdot & \cdot & \cdot & 0 & 0 & \cdot & \cdot \\
11 & \cdot & \cdot & \cdot & 13 & \cdot & \cdot & \cdot & 13 & \cdot & 3 & 17 & \cdot & \cdot & \cdot & \cdot & \cdot & \cdot & \cdot & \cdot & \cdot & 0 & 0 & \cdot \\
25 & \cdot & 8 & \cdot & 23 & 18 & \cdot & 14 & 9 & \cdot & \cdot & \cdot & \cdot & \cdot & \cdot & \cdot & \cdot & \cdot & \cdot & \cdot & \cdot & \cdot & 0 & 0 \\
3 & \cdot & \cdot & \cdot & 16 & \cdot & \cdot & 2 & 25 & 5 & \cdot & \cdot & 1 & \cdot & \cdot & \cdot & \cdot & \cdot & \cdot & \cdot & \cdot & \cdot & \cdot & 0
\end{array}\right]$$

The QC-LDPC of the 802.11n standard has only 1/2, 2/3, 3/4 and 5/6 code rates, and lacks LDPC codes of low code rates. At least one embodiment of the present disclosure provides LDPC codes with low code rates applicable to 802.11n standard, including 1/6, 1/4 and 1/3 code rates when existing codec structures can be multiplexed, and these code rates can be used in low signal-to-noise ratio and long-distance transmission environment.

In at least one embodiment of the present disclosure, the permutation matrix of 1/6, 1/4 and 1/3 code rates can adopt a structure similar to 1/2, 2/3, 3/4 and 5/6 code rates, and multiplexing the LDPC codec with the code rates of 1/2, 2/3, 3/4 and 5/6 of QC-LDPC of the aforementioned 802.11n standard. For example, FIG. 6A, FIG. 6B and FIG. 6C are permutation matrix forms of 1/6, 1/4 and 1/3 code rates respectively. X in each matrix is a cyclic value to be designed. The sizes of these permutation matrices are 20*24, 18*24 and 16*24 respectively.

Many of the present disclosure provide a method of designing QC-LDPC codes and the obtained QC-LDPC codes. These methods include methods of designing a base matrix, designing a permutation matrix through the base matrix, and the like. The following describes these methods, the obtained LDPC codes and the permutation matrix.

At least one embodiment of the present disclosure provides a method for constructing a base matrix of a permutation matrix for QC-LDPC codes, with reference to the schematic diagram of FIG. 7, and the method includes the following steps.

At Step 710, the code rate of the permutation matrix is obtained, and the number Ns of columns corresponding to systematic bits in the base matrix and the number Nrow of rows of the base matrix are determined according to the code rate.

At Step 720, the maximum row weight dc of the base matrix and the total weight range of the base matrix are determined, wherein the row weight of each row in the base matrix is dc or dc−1.

At Step 730, according to the total weight range of the base matrix and the number Nrow of rows of the base matrix, a first range of rows with the row weight dc−1 and a second range of rows with the row weights of dc are determined.

At Step 740, according to the number Nrow of rows, the total weight range, the first range and the second range of the base matrix, the systematic bit part of each row in the initial base matrix corresponding to the base matrix is filled to obtain an intermediate base matrix.

At Step 750, the intermediate base matrix is convergence-calculated to determine whether the intermediate base matrix converges, and the intermediate base matrix is determined as the base matrix in response to the intermediate base matrix converging.

For example, the systematic bit part of the initial base matrix is completely blank or is so that at least some elements have been filled.

The above method for constructing the base matrix of the permutation matrix for QC-LDPC codes in the disclosed embodiment can conveniently construct the base matrix meeting the performance requirements for further constructing the corresponding permutation matrix, especially the permutation matrices for the above 1/6, 1/4 and 1/3 code rates.

For example, in at least one embodiment of the present disclosure, the above method for constructing the base matrix of the permutation matrix for QC-LDPC codes further includes: resetting at least some parameters of the intermediate base matrix in response to the intermediate base matrix not converging, re-filling the systematic bits of each row of the reset intermediate base matrix to obtain a new intermediate base matrix, performing convergence calculation on the new intermediate base matrix, and determining the new intermediate base matrix as the base matrix in response to the new intermediate base matrix converging.

For example, in at least one embodiment of the present disclosure, in one example of step 750, the performing the convergence calculation includes: obtaining signal-to-noise ratio (SNR) and a number of iterations, and performing the convergence calculation by using a density evolution tool (e.g., off-prototype information transfer (PEXIT)) according to the SNR and the number of iterations.

It should be noted that the above steps 710-750 are not limited to being executed in the above order, and respective steps can be executed alternately or simultaneously in parallel as long as there is no conflict. For example, step 710 and step 720 can be executed alternately or simultaneously in parallel.

In at least one embodiment, the code rate of the permutation matrix to be designed is 1/6, 1/4 or 1/3. For example, the total weight range of the corresponding base matrix is from 79 to 88; for 1/6 code rate, the maximum row weight dc=5 or 4; for 1/4 code rate, the maximum row weight dc=5; for 1/3 code rate, the maximum row weight dc=6 or 5. In this way, it can be multiplexed with the codec of LDPC codes of 1/2~5/6 code rates, which can be used in low signal-to-noise ratio and long-distance transmission environment, and at the same time, the development cost and manufacturing cost are reduced.

In at least one embodiment of the present disclosure, the codec encodes or decodes based on the permutation matrix, and performs the process according to the rows of the permutation matrix, for example, one element in the permutation matrix is processed in one clock cycle, and for example, two processing units are arranged to sequentially (for example, row by row) process the elements in the permutation matrix. At this time, the inventor noticed that if the row weight difference of permutation matrix (for example, between two adjacent rows) is relatively large, then speeds of the two processing units will not match, and at this time, more extra clock cycles will be needed to wait, so the implementation of the decoder hardware will be troublesome and the decoding speed will be affected. Therefore, when designing the base matrix, in at least one embodiment of the present disclosure, the row weights of the adjacent two rows differ by at most 1 (the same strategy as the WiFi high code rate QC-LDPC code). In addition, the total decoding speed depends on the number of is in the base matrix, so it is chosen to limit the total weight of the base matrix to 79~88, and clock frequency for the codec of the LDPC codes with 1/2~5/6 code rates is multiplexed, or, the clock frequency is scaled with the bandwidth proportionally. In addition, memory cells of the codec are arranged according to the total weight of the base matrix, so that the codec with the total weight of 79-88 does not add additional memory cells compared with LDPC codes with, for example, 1/2-5/6 code rates. In addition, at the same time, the above-mentioned row weight can provide the LDPC codes with better performance compared with smaller row weight.

Figure 8:
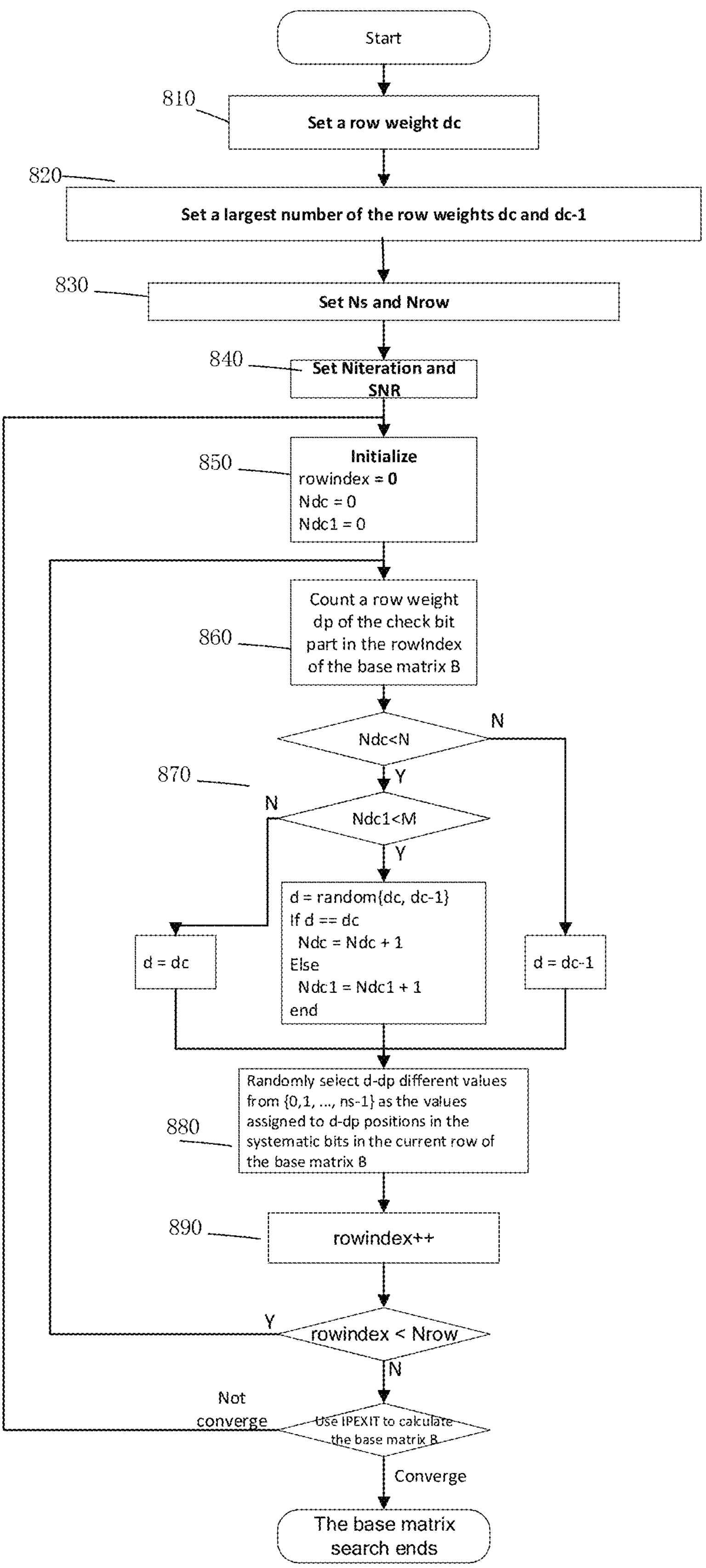
FIG. 8 is a schematic diagram of the flow of designing the base matrix according to an embodiment of the present disclosure.

The flow of designing the base matrix will be explained by taking the code rates of 1/6, 1/4 or 1/3 as an example. The flow is shown in FIG. 8. In addition, for code rates of 1/6, 1/4 and 1/3, the sizes of the permutation matrices are 20*24, 18*24 and 16*24, respectively, and the corresponding permutation matrix forms are shown in FIG. 6A, FIG. 6B and FIG. 6C, respectively. In each permutation matrix to be designed, x is the cyclic value to be designed.

As shown in FIG. 8, at step 810, the maximum row weight dc of the base matrix to be designed is determined, for example, the row weight of each row of the base matrix is randomly selected in {dc, dc−1}, for example:

a) For 1/6 code rate, the maximum row weight dc=5 or 4;
b) For 1/4 code rate, the maximum row weight dc=5;
c) For 1/3 code rate, the maximum row weight dc=6 or 5.

The total weight of the base matrix to be designed is set within the range of 79~88. At step 820, the range of the number of rows with the row weights of dc−1 in the base matrix is determined, and is for example, at most M rows, and the range of the number of rows with the row weights of dc is determined, for example, and is at most N rows, for example:

a) For 1/6 code rate, dc=5: M=20, and N=8/7/6/5/4/3/2/1/0;
b) For 1/6 code rate, dc=4: M=1, and N=20;
c) For 1/4 code rate, dc=5: M=18, and N=16/15/14/13/12/11/10/9/8/7;
d) For 1/3 code rate, dc=6: M=16, and N=8/7/6/5/4/3/2/1/0;
e) For 1/3 code rate, dc=5: M=1, and N=16.

The above values are only examples. For example, the value of N may also be fixed, and the value range of M may be given. For example, for 1/6 code rate, dc=5: N=8, and M=12~20.

At step 830, the number Ns of columns corresponding to systematic bits in the base matrix is set to be used when randomly generating positions of elements in the base matrix, and the number Nrow of rows of the base matrix is determined. For this, for example, further refer to FIG. 6A to FIG. 6C:

a) For 1/6 code rate, Ns=4, and Nrow=20;
b) For 1/4 code rate, Ns=6, and Nrow=18;
c) For 1/3 code rate, Ns=8, and Nrow=16.

At step 840, the signal-to-noise ratio (SNR) and the number of iterations for the PEXIT tool are set.

After the above parameters are set, processing is performed from the first row to the last row of the base matrix to be designed, for example, processing each row in sequence. During each process, it is necessary to record the number of rows with the current row weights of dc and the number of rows with the row weights of dc−1 in the base matrix to be designed, and record them as Ndc and Ndc1, respectively. The initial values of these two examples are 0s. At step 850, Ndc and Ndc1 are initialized to 0s, and the index (rowindex) of the current row is initialized to 0 (corresponding to row 0).

For the current row, if Ndc<N and Ndc1<M, one is randomly selected in {dc, dc−1} as the row weight of this row, assuming that the row weight is d, and Ndc or Ndc1 are added by 1 correspondingly; if Ndc≥N, dc−1 is selected as the row weight d of this row; if Ndc1≥M, then dc is selected as the row weight d of this row. It should be pointed out that there will be no case where Ndc≥N and Ndc1≥M at the same time. Further, the current row weight of the current row is determined (for example, if there are already non-zero elements (e.g., 1s) except the cyclic value x to be designed, then the current row weight of the current row is greater than 1), and it is recorded as dcurr, so that the row weight to be supplemented is ds=d−dcurr, and then non-zero values, e.g., is are filled in ds positions that are randomly selected among positions marked with x in the current row of the above base matrix, and the rest positions are filled with 0s.

When all the rows in the base matrix to be designed are processed as above, a base matrix with randomly configured systematic bits is obtained, which can be called an intermediate base matrix. According to the code rate of the base matrix (for example, 1/6, 1/4 or 1/3), the signal-to-noise ratio (SNR) and the number of iterations are selected, and then the intermediate base matrix is calculated by using a density evolution tool (for example, PEXIT tool). If the calculation converges, then it is considered to have found a suitable backup base matrix; if the calculation does not converge, then the currently obtained intermediate base matrix is abandoned, all parameters of the base matrix to be designed are reset, for example, the systematic bits corresponding to the cyclic value x in the base matrix as shown in FIG. 6A to FIG. 6C are reset, Ndc and Ndc1 are reset, and processing from the first row of the base matrix to be designed is started, for example, each row is sequentially processed to obtain again a new intermediate base matrix whose systematic bits are randomly reconfigured. For the new base matrix, the density evolution tool is still used to judge whether it converges in the calculation. Through the above processes, a plurality of suitable backup matrix can be obtained for the same code rate.

With specific reference to the example shown in FIG. 8, at step 860, the row weight dp of the check bit part in the current row (i.e. the row pointed by the rowindex) is determined; at step 870, it is first judged whether Ndc<N is true, if not (N), then the row weight d of the current row is set to dc−1, i.e., d=dc−1, otherwise (Y), then it is continuously judged whether Ndc1<M is true, if not (N), the row weight d of the current row is set to dc, i.e., d=dc, otherwise (Y); a value is randomly selected from dc and dc−1 to be assigned to d, if dc is selected, then Ndc is incremented by 1, and if dc−1 is selected, then Ndc1 is incremented by 1; at step 880, d-dp different values are randomly selected from the {0, 1, . . . , ns−1} set as the values assigned to d-dp positions in the systematic bits in the current row of the base matrix B; at step 890, the parameter rowindex is incremented by 1, and then it is judged whether rowindex is less than Nrow. If yes, it indicates that not all the rows of the base matrix have been processed, so it returns to step 860 to process the rows pointed by the incremented rowindex. Otherwise, all the rows of the base matrix have been processed, and the base matrix is calculated by PEXIT tool. If it converges, the search of the base matrix is completed; if not, it returns to step 850 to start a new search of the base matrix.

Figure 9:
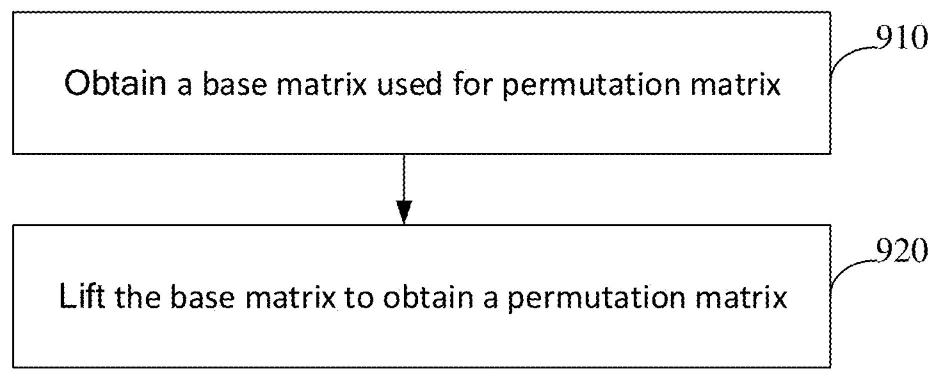
FIG. 9 is a schematic diagram of a method for constructing a permutation matrix for QC-LDPC codes according to an embodiment of the present disclosure.

At least one embodiment of the present disclosure further provides a method for constructing a permutation matrix for QC-LDPC codes. As shown in FIG. 9, the method includes the following steps.

At Step 910, a base matrix used for permutation matrix is obtained.

At Step 920, the base matrix is lifted to obtain a permutation matrix.

In the above method, the base matrix at step 910 is not limited to the base matrix obtained according to the above-mentioned embodiment such as that shown in FIG. 7, but may also be the base matrix obtained by other methods. The base matrix is lifted at step 920 to obtain the required permutation matrix.

For example, step 920 includes: obtaining the protograph of the base matrix, obtaining each macro-cycle in the protograph, and determining the size of the short cycle corresponding to the macro-cycle in a Tanner graph of the check matrix corresponding to the permutation matrix by the equivalent cyclic value ECS of the macro-cycle, and determining whether at least one cyclic value in the macro-cycle needs to be set according to the size of the short cycle. The permutation matrix obtained in step 920 can be used to obtain the check matrix of QC-LDPC code.

The method for constructing the permutation matrix for QC-LDPC codes in the disclosed embodiment can conveniently and quickly obtain the backup permutation matrix, and is beneficial to judging the performance of the permutation matrix.

In the embodiment of the present disclosure, the "macro-cycle" refers to the cycle occurred in the protograph, while the "short cycle" refers to the cycle occurred in the corresponding check matrix. As mentioned above, for one macro-cycle in the protograph, there is at least one short cycle in the corresponding check matrix.

In at least one embodiment of the present disclosure, the above step 920 may further include: making the ECSs of all macro-cycles in the protograph meet the requirements of the Tanner graph of the check matrix for the minimum short cycle and the external information freedom degree.

The lifting of the base matrix is to determine the cyclic values of the positions of is in the base matrix, while the positions of 0s in the base matrix are, for example, assigned with values of −1 (which means all−0 submatrix). The lifting process includes the process of interleaving and permuting the protograph to generate the corresponding Tanner graph of the check matrix (i.e., the real Tanner graph). The cycles of Tanner graph have great influence on the performance of LDPC codes. The information transfer decoding algorithm of LDPC codes assumes that the variable nodes are independent of each other, but the existence of short cycles in the Tanner graph of the corresponding check matrix will inevitably destroy the independence assumption, which will degrade the decoding performance. Generally, the longer the length of the shortest cycle in the Tanner graph of the corresponding check matrix is, the closer the decoding performance is to the optimal algorithm. For example, in the embodiment of the present disclosure, the length of the shortest cycle is 6 or more, i.e., the minimum cycle threshold is 6 or more. For the Tanner graph of the check matrix, the greater the external information freedom degree is, the better the performance of the corresponding LDPC code is, especially the steeper the error rate curve is. Therefore, after judging that a cycle meets the length constraint, it is necessary to further judge whether the external information freedom degree is greater than a certain value.

During the research, the inventor found a quantitative relationship between the cycles on the protograph and the cycles on the Tanner graph of the corresponding check matrix. According to this quantitative relationship, information of the cycles on the Tanner graph of the corresponding check matrix can be obtained by searching the base matrix.

In at least one embodiment of the present disclosure, step 920 further includes: obtaining the equivalent cyclic values (ECSs) of the macro-cycles, wherein it is assumed that the macro-cycle of size 2*L on the protograph is composed of cyclic values $\{P(i_0,j_0), P(i_0,j_1), P(i_1,j_1), P(i_1,j_2), \ldots,$ $P(i_{(L-1)},j_L)\}$, wherein $j_L=j_0$, L is a positive integer, then the equivalent cyclic value (ECS) is determined by the following:

$$ECS=\sum_{l=0}^{L-1}(-P(i_l,j_l)+P(i_l,j_{l+1})).$$

Then, there are the following conclusions:

If a greatest common divisor of the ECS and a lifting factor Z of a macro-cycle in the protograph is q, then the size of the short cycle of Tanner graph of the check matrix corresponding to the macro-cycle in the protograph is 2*L*Z/q, and the number q of short cycles generated with the size of 2*L*Z/q in the Tanner graph of the corresponding check matrix corresponding to the macro-cycle of the protograph is q.

In one example, assuming Z=8, the permutation matrix is P as follows, so there is a macro-cycle with the size 4 (2*L, L=2) on the protograph corresponding to P $$P=\begin{bmatrix}3&5\\1&2\end{bmatrix}$$

Figure 10:
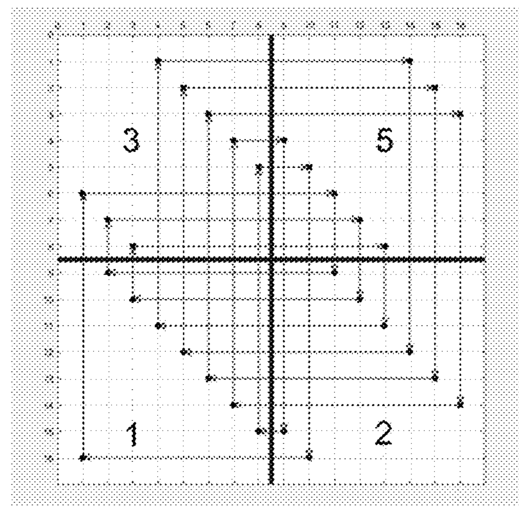
FIG. 10 is a schematic of a short cycle in the Tanner graph of an exemplary permutation matrix.

ECS=−3+5−2+1=1, then the greatest common divisor of ECS and Z is q=1, then the size of the short cycle of Tanner graph of the check matrix corresponding to the protograph is 2*2*8/1=32, and the number of short cycles with the size of 32 in the Tanner graph of the corresponding check matrix is 1. As shown in FIG. 10 below, it is possible to draw a graph through the permutation matrix to illustrate that there is only one short cycle with the size of 32 in the Tanner graph. The numbers in the graph are the cyclic values, and black dots in the graph indicate a cyclic unit matrix corresponding to the cyclic values. Starting from H(6,1), the adjacent nodes are connected in turn, finally returning to H(6,1). This indicates that there is only one short cycle.

In another example, assuming Z=8, the permutation matrix is P as follows, so there is a macro-cycle of size 4 (2*L, L=2) on the protograph corresponding to P $$P=\begin{bmatrix}3&6\\1&2\end{bmatrix}$$

Figure 11:
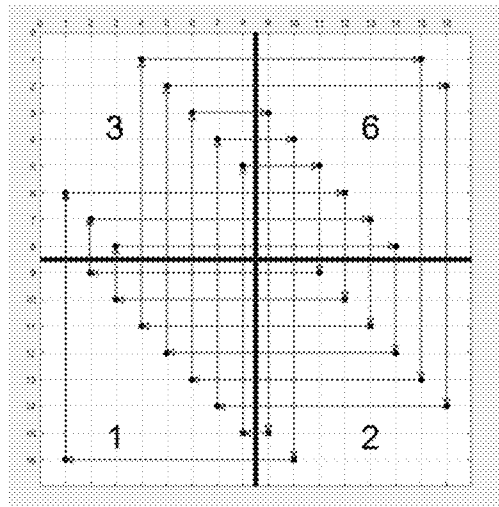
FIG. 11 is a schematic diagram of the short cycle in the Tanner graph of an exemplary permutation matrix.

ECS=−3+6−2+1=2, then the greatest common divisor of ECS and Z is q=2, then the size of the short cycle of the Tanner graph of the check matrix corresponding to the protograph is 2*2*8/2=16, and the number of short cycles with the size of 16 in the Tanner graph is 2. As shown in FIG. 11, it can be seen that there are two short cycles with the size 16.

In at least one embodiment of the present disclosure, the method of recursively calling tree search is adopted to lift the base matrix. In this embodiment, each variable node in the protograph of the base matrix is taken as a root node to expand into a tree, and the tree is searched to check whether there is a macro-cycle corresponding to the tree.

Figure 12:
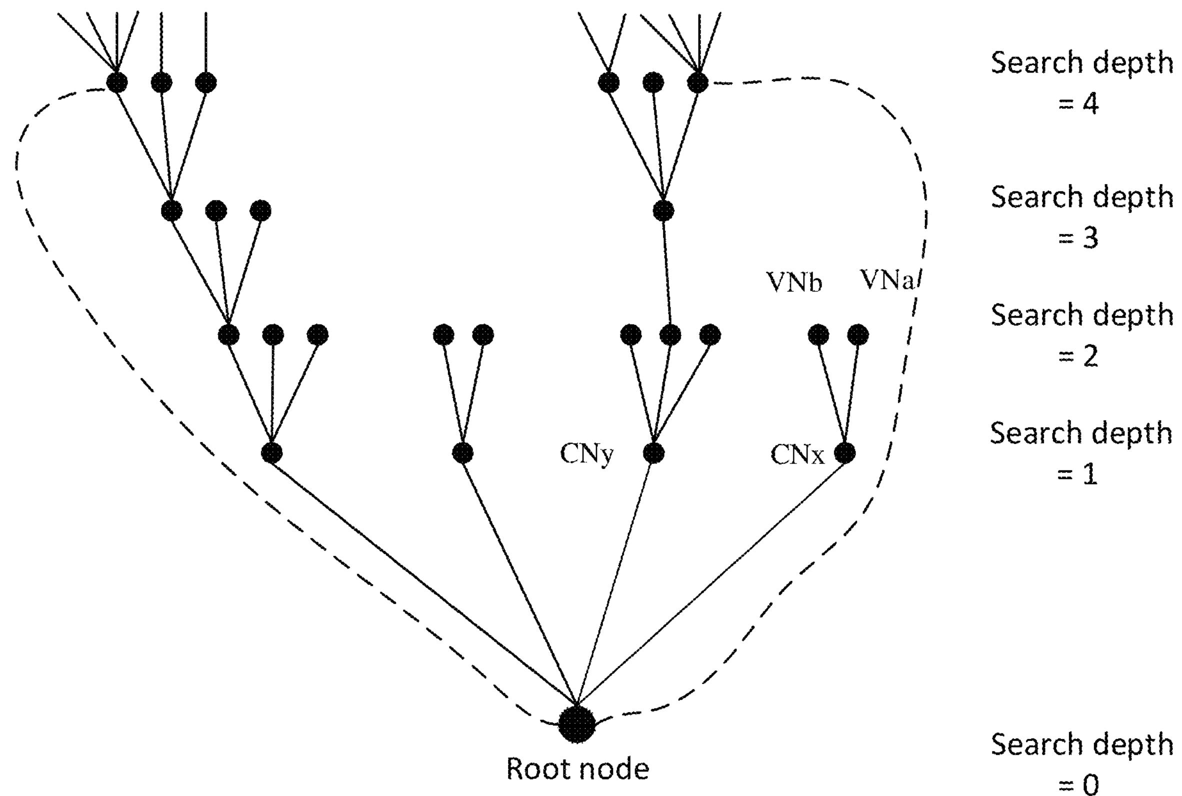
FIG. 12 is an exemplary schematic diagram of an expanded tree with a variable node of the base matrix as the root node.

FIG. 12 shows a tree expanded with variable nodes of the base matrix as root nodes for tree search. Each variable node of the matrix will be expanded into a tree, which tree may have one or more macro-cycles, as shown in FIG. 12, and a dotted row indicates one formed macro-cycle. For each macro-cycle, according to the above-mentioned relationship between the equivalent cyclic value ECS and the short cycle, each cyclic value in the macro-cycle is appropriately allocated to meet the set minimum cycle threshold on the Tanner graph of the check matrix.

In at least one embodiment of the present disclosure, in the tree search using the recursively calling method, the whole search is divided into two kinds of node processing: variable node processing function and check node processing function. At the beginning, the variable node processing function is called from the root node, because a neighbor node of the variable node in the tree is a check node, and the neighbor node of the variable node is processed in the variable node processing function by the check node processing function called again, and the neighbor node of the check node is another variable node, so the neighbor node of the check node is processed in the check node processing function by the variable node processing function called again, and so on, until all macro-cycles originating from the root node are found, and cyclic values are assigned to each macro-cycle to form the permutation matrix P, and the ECSs of all macro-cycles meet the requirements of the minimum cycle on the Tanner graph and the external information freedom degree.

Figure 13:
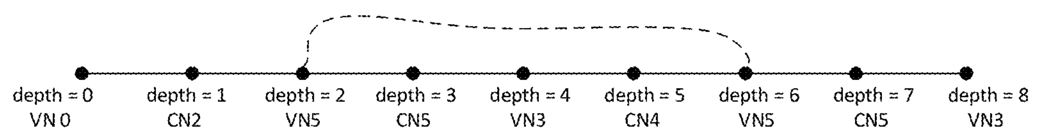
FIG. 13 is a schematic diagram of the process of performing a tree search.

For example, in at least one example, as shown in the schematic diagram of FIG. 13, each variable node in the protograph of the base matrix is taken as the root node to expand into a tree, and tree search is performed on the tree to check whether there is a macro-cycle corresponding to the tree, including the following steps.

At Step 1310, according to the base matrix, the variable node information and check node information of the protograph of the base matrix are established.

At Step 1320, based on the variable node information and the check node information, a transfer information combination used for transferring among nodes during the tree search is established.

At Step 1330, an initial value of the transfer information combination is set, and the tree is recursively called to search the tree to check whether there is a macro-cycle corresponding to the tree.

For example, the variable node information and the check node information each include a node index, the number of neighbor nodes, and an index array of the neighbor nodes.

For example, the transfer information combination includes a root node index, a parent node index, a current search depth and a cycle node index, and the cycle node index is used to record the node indexes of all nodes forming a cycle. For example, the transfer information combination may also include the minimum cycle threshold of the Tanner graph of the check matrix and the minimum threshold of the external information freedom degree of the Tanner graph of the check matrix.

For example, during the process of the tree search, for each currently searched variable node in the tree: if the current search depth has met the minimum cycle threshold of the Tanner graph of the check matrix, the tree search is stopped and a success flag is returned; if the current search depth does not reach the minimum cycle threshold, but a first macro-cycle has been found in the tree search, the equivalent cyclic value ECS of the first macro-cycle is used to check or allocate the cyclic values constituting the first macro-cycle, so that the short cycle on the Tanner graph of the check matrix meets the minimum cycle threshold or more; or, if the current search depth does not reach the minimum cycle threshold, and any macro-cycle is found in the tree search, then the tree search is continued.

For example, during the process of tree search, for each currently searched check node in the tree: if the current search depth has met the minimum cycle threshold of the Tanner graph of the check matrix, the tree search is stopped and a success flag is returned; if the current search depth does not reach the minimum cycle threshold, but a second macro-cycle has been found in the tree search, the equivalent cyclic value ECS of the second macro-cycle is used to check or allocate the cyclic values constituting the second macro-cycle, so that the short cycle on the Tanner graph of the check matrix meets the minimum cycle threshold or more; or if the current search depth does not reach the minimum cycle threshold, and any macro-cycle is found in the tree search, then the tree search is continued.

For example, during the process of tree search, each variable node currently searched in the tree is further checked for deadlock, and if deadlock occurs, the tree search is stopped.

The equivalent cyclic value ECS of the first macro-cycle or the second macro-cycle is used to correspondingly check or allocate respective cyclic values of the first macro-cycle or the second macro-cycle, including the following steps. If a cyclic value of the first macro-cycle or the second macro-cycle has not been allocated, then a value is randomly selected in [0, Z−1], and if the ECS of the first macro-cycle or the second macro-cycle meets the minimum cycle threshold, then the tree search is stopped and a success flag is returned; or, if all the cyclic values constituting the first macro-cycle or the second macro-cycle have been allocated, but the ECS of the first macro-cycle does not meet the minimum cycle threshold, then the cyclic value that can be changed in the first macro-cycle or the second macro-cycle is selected and incremented by 1, and modulo Z is performed to obtain a new cyclic value, and then a new search is started from the root node, wherein Z is the lifting factor.

The exemplary method of the embodiment of the present disclosure will be described below with specific examples of the above-mentioned cases where the code rates are 1/6, 1/4 and 1/3.

The base matrix and its protograph are obtained. As mentioned above, when the code rates are 1/6, 1/4 and 1/3, the sizes of the base matrices are 20*24, 18*24 and 16*24, respectively. The base matrix is traversed and the variable node information VNode[24] and the check node information CNode[Nrow] are established for the base matrix, wherein Nrow is 20, 18 and 16. Here, it is assumed that the base matrix B is m×n dimension, and the node information NodeInf of each node (hereinafter referred to as "current node") may include the following contents:

$$NodeInf\begin{cases} nodeID \\ \text{size} \\ \text{index}\,[24] \end{cases}$$

Herein nodeID represents the index of the current node. For example, for variable nodes, the index value is [0, n−1], and for check nodes, the index value is [0, m−1]; the size indicates the number of neighbor nodes of the current node, i.e., the number of nodes connected to a node in the protograph; index[24] indicates an index array of neighbor nodes of the current node. As mentioned above, the maximum number of rows and columns of the base matrix is 24, so the maximum number of elements in the array is 24.

In order to facilitate the tree search, the transfer information transferred between (adjacent) nodes during the tree search is established, which can include the following contents:

$$InfTransfer\begin{cases} origVnID \\ \text{parent} \\ \text{depth} \\ cycleThresh \\ emdThresh \\ IDsInCycle \end{cases}$$

In the protograph, one macro-cycle starts from the variable node and then returns to the variable node after searching, so the initial root nodes in the tree search process are all variable nodes. On the contrary, each variable node in the protograph of the base matrix is taken as the root node to expand into a tree, and the tree is searched to check whether there is a macro-cycle corresponding to the tree. During the tree search, each level of nodes above the root node needs to know the index of the root node, so as to know whether a macro-cycle has been formed. Here, origVnID represents the index of the root node.

"Parent" represents a parent node of the current node, because there is this parent node in the neighbor node list of this node, so the parent node is not searched during the searching, which can make the searching proceed in one direction and avoid the deadlock.

"Depth" indicates that the current node is located in the search depth of the tree to determine whether the search target has been reached. If the search depth exceeds the minimum cycle threshold defined below, the searching can be stopped to save search resources and reduce search time.

"CycleThresh" represents the minimum cycle threshold of the Tanner graph of the target check matrix, i.e., the length of the shortest cycle. As mentioned above, the longer the length of the shortest cycle is, the closer the decoding performance is to the optimal algorithm, and the minimum cycle threshold can be selected according to the required decoding performance to achieve the balance between decoding performance and the above search resources and time. For example, the minimum cycle threshold may be 6 or more.

"EmdThresh" represents the minimum threshold of the external information freedom degree.

For example, IDsInCycle is an array with a length longer than cycleThresh, and is used to record the indexes of all nodes that make up a cycle.

In another example, cycleThresh and emdThresh can be saved and called as system parameters without being used as part of the transfer information. For example, cycleThresh may be selected to be greater than or equal to 6, and emdThresh may be selected to be greater than or equal to 3.

Before the recursive call of tree search, the initial value of the transfer information is firstly set, for example:

$$InfTransfer\begin{cases} origVnID = \text{Root Node } ID \\ \text{parent} = -1 \\ \text{depth} = 0 \\ cycleThresh = 6 \\ emdThresh = 4 \\ IDsInCycle \end{cases}$$

When the variable nodes of the base matrix are used as root nodes for tree search, each variable node will be expanded into a tree, and the obtained exemplary tree is shown in FIG. 12, for example. In this tree, in the process of searching up along the root node, at each node, it is possible to know whether the node is a variable node or a check node, the number of its neighbor nodes and what nodes there are.

At the same time, it is possible to know the historical information of the current search by transferring information. For example, in FIG. 12, the root node is adjacent to four check nodes. For example, if the search starts from the neighbour nodes on the right, then the first check node CNx on the right is firstly searched, which has two adjacent variable nodes VNa and VNb. Then, the variable node VNa on the right is firstly searched, but this branch ends here, so the search of this branch is finished, and then the variable VNb on the left is searched again, but this branch ends here. Therefore, the search of this branch is finished. At this time, the search of the first check node CNx has been completed, and then the second check node CNy on the right of the root node is further checked in the manner described above.

The processing of each variable node (hereinafter referred to as "current variable node") is as follows.

Firstly, it is judged whether the search depth corresponding to the current variable node has met the minimum cycle threshold, and if it meets depth>cycleThresh, then the search of this branch where the current variable node is reached is stopped, and a success flag is returned.

If the search depth does not reach the minimum cycle threshold, i.e., depth>cycleThresh is not met, but one macro-cycle (for example, referred to as "the first macro-cycle" here) has been found through the search, i.e., the index of the current variable node is the same as the index origVnID of the root node, then the above-mentioned equivalent cyclic value (ECS) is applied to check or allocate the cyclic values of respective nodes constituting this macro-cycle, so as to ensure that the short cycle on the Tanner graph of the corresponding check matrix is greater than or equal to cycleThresh. As mentioned above, respective nodes of this macro-cycle can be obtained through the IDsInCycle array. Next, respective cyclic values on the macro-cycle are allocated (assigned with values). If a certain cyclic value has not been assigned, a value is randomly selected in [0, Z−1]. If the ECSs of the macro-cycle obtained after assigning respective cyclic values meet the condition of the minimum cycle on the Tanner graph of the corresponding check matrix, i.e., depth*Z/q≥cycleThresh, the search of this branch is stopped and a success flag is returned; if all the cyclic values have been allocated, but the ECS of the obtained macro-cycle does not meet the condition of the minimum cycle on Tanner graph, i.e., depth*Z/q<cycleThresh, then the cyclic value that can be changed (the cyclic value corresponding to the check bit cannot be changed, but the cyclic value corresponding to the systematic bit can be changed) in this macro-cycle is incremented by 1 and the modulo Z is performed to obtain a new cyclic value, for example, the cyclic value that has the deepest search depth and can be changed is incremented by 1 and the modulo Z is performed to obtain a new cyclic value, and then a new round of search starts from the first variable node. For macro-cycles that meet the minimum cycle condition of the Tanner graph of the corresponding check matrix, it is checked whether the Tanner graph of the check matrix corresponding to the macro-cycle meets the set minimum threshold of external information freedom degree, i.e., whether the external information freedom degree of the Tanner graph of the check matrix is >emdThresh, if so, the subsequent operations are continued to keep the corresponding permutation matrix, otherwise, for example, the search ends, and for example, the next backup base matrix is obtained and it is lifted to obtain the permutation matrix.

If the search depth doesn't reach the minimum cycle threshold, i.e., depth≤cycleThresh, and no macro-cycle is found, the nodeID of the current variable node is added to the IDsInCycle array, i.e., IDsInCycle[depth]=nodeID, the depth is incremented by 1, and the check nodes in the neighbor nodes of the current variable node are called one by one, except those whose IDs are parent. The processing of the check nodes will be as follows.

As the deadlock may occur in the process of the tree search, as shown in FIG. 13, when depth=2, the variable node 5 (VN5) itself has a macro-cycle of size 4 (as shown by dotted rows in the figure, it goes from node VN5, node CN5, node VN3, node CN4, and then back to node VN5). If the macro-cycle is not removed when the search depth=6 and the variable node 5 is reached, the search deadlock will be formed if the search continues. Therefore, for every variable node, it is necessary to check whether there is deadlock, and if there is a deadlock, the search of this branch in the tree is stopped. Since IDsInCycle has stored all the ancestor nodes, it is easy to check the deadlock. It is possible to determine whether there is a deadlock as long as the variable node IDs of the ancestor nodes except the first variable node are compared with the current variable node ID.

The processing for each check node (hereinafter referred to as "current check node") is as follows.

Firstly, it is judged whether the search depth depth corresponding to the current check node has met the minimum cycle threshold, and if it meets depth>cycleThresh, the search of this branch where the current check node is reached is stopped and a success flag is returned.

If the search depth does not reach the minimum cycle threshold, that is, it does not meet the requirement of depth>cycleThresh, but a macro-cycle (for example, referred to as "the second macro-cycle" here) has been found through the search, that is, the index of the current check node is the same as the index origVnID of the root node, then the above-mentioned equivalent cycle value (ECS) is applied to check or allocate the cycle values of each node constituting this macro-cycle, so as to ensure that the short cycle on the Tanner graph of the corresponding check matrix meets the requirement of being larger or equal to the cycleThresh. As mentioned above, respective nodes of this macro-cycle can be obtained through the IDsInCycle array. Next, the respective cyclic values on the macro-cycle are allocated (are assigned with values). If a certain cyclic value has not been allocated, a value is randomly selected in [0, Z−1]. If the ECS of the macro-cycle obtained after allocating respective cyclic values meets the condition of the minimum cycle on the Tanner graph of the corresponding check matrix, i.e., depth*Z/q≥cycleThresh, the search of this branch is stopped and a success flag is returned; if all the cyclic values have been allocated, but the ECS of the obtained macro-cycle does not meet the condition of the minimum cycle on Tanner graph, i.e., depth*Z/q<cycleThresh, then the cyclic value that can be changed (the cyclic value corresponding to the check bit cannot be changed, but the cyclic value corresponding to the systematic bit can be changed) in this macro-cycle is incremented by 1 and modulo Z is performed to obtain a new cyclic value, and for example, the cyclic value that has the deepest search depth and can be changed is incremented by 1 and modulo Z is performed to obtain a new cyclic value. Then a new round of search from the first variable node is started. Similarly, for a macro-cycle that meets the condition of the minimum cycle on the Tanner graph of the corresponding check matrix, it is checked whether the Tanner graph of the check matrix corresponding to the macro-cycle meets the set minimum threshold of the external information freedom degree, i.e., whether the external information freedom degree of the Tanner graph of the check matrix is >emdThresh, if so, the subsequent operation is continued to keep the corresponding permutation matrix, otherwise, for example, the search ends, and for example, the next backup base matrix is obtained and it is lifted to obtain the permutation matrix.

If the search depth does not reach the minimum cycle threshold, i.e., depth≤cycleThresh, and no macro-cycle is found, the nodeID of the current check node is added to the IDsInCycle array, i.e., IDsInCycle[depth]=nodeID, the depth is incremented by 1, and the variable nodes in the neighbor nodes of the current check node are called one by one, except for those whose ID is parent. The processing of the check node is as described above.

Similarly, for every check node, it is necessary to check whether there is a deadlock. If there is a deadlock, it is necessary to stop the search of this branch in the tree. Since the IDsInCycle has stored all the ancestor nodes, it is easy to check the deadlock. It is possible to determine whether there is a deadlock as long as the check node IDs of the ancestor nodes except the first check node are compared with the current check node ID.

One or more (backup) permutation matrices that meet the requirements are obtained by lifting the base matrix in the above-mentioned way.

In at least one embodiment of the present disclosure, one or more permutation matrices are provided, wherein, for the permutation matrix of 1/6 code rate, the permutation matrix of the code length of 1944 is as follows:

$$
\begin{bmatrix}
\cdot & \cdot & 19 & 35 & 1 & 0 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot \\
\cdot & \cdot & \cdot & 40 & \cdot & 0 & 0 & \cdot & \cdot & \cdot & \cdot & \cdot & \cdot & \cdot & \cdot & \cdot & \cdot & \cdot & \cdot & \cdot & \cdot & \cdot & \cdot & \cdot \\
53 & \cdot & \cdot & 28 & \cdot & \cdot & 0 & 0 & \cdot & \cdot & \cdot & \cdot & \cdot & \cdot & \cdot & \cdot & \cdot & \cdot & \cdot & \cdot & \cdot & \cdot & \cdot & \cdot \\
38 & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot & \cdot & \cdot \\
19 & \cdot & \cdot & 58 & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot & \cdot \\
80 & \cdot & \cdot & 11 & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot \\
30 & \cdot & \cdot & 45 & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot \\
17 & \cdot & \cdot & 26 & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot \\
\cdot & 65 & 50 & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot \\
50 & \cdot & 43 & \cdot & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot \\
27 & \cdot & \cdot & \cdot & 0 & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot \\
50 & \cdot & \cdot & 56 & \cdot & \cdot & \cdot & \cdot & \cdot & \cdot & \cdot & \cdot & \cdot & \cdot & \cdot & 0 & 0 & \cdot & \cdot & \cdot & \cdot & \cdot & \cdot & \cdot \\
18 & \cdot & \cdot & 52 & \cdot & \cdot & \cdot & \cdot & \cdot & \cdot & \cdot & \cdot & \cdot & \cdot & \cdot & \cdot & 0 & 0 & \cdot & \cdot & \cdot & \cdot & \cdot & \cdot \\
60 & \cdot & \cdot & 77 & \cdot & \cdot & \cdot & \cdot & \cdot & \cdot & \cdot & \cdot & \cdot & \cdot & \cdot & \cdot & \cdot & 0 & 0 & \cdot & \cdot & \cdot & \cdot & \cdot \\
15 & \cdot & \cdot & 48 & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot & \cdot \\
58 & \cdot & \cdot & 44 & \cdot & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot \\
18 & \cdot & \cdot & 31 & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot & \cdot \\
\cdot & 12 & 80 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot \\
42 & \cdot & \cdot & 62 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 \\
49 & \cdot & \cdot & 25 & 1 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0
\end{bmatrix}
$$

The permutation matrix of the code length of 1296 is as follows:

$$
\begin{bmatrix}
\cdot & \cdot & 46 & 48 & 1 & 0 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot \\
\cdot & \cdot & \cdot & 42 & \cdot & 0 & 0 & \cdot & \cdot & \cdot & \cdot & \cdot & \cdot & \cdot & \cdot & \cdot & \cdot & \cdot & \cdot & \cdot & \cdot & \cdot & \cdot & \cdot \\
41 & \cdot & \cdot & 33 & \cdot & \cdot & 0 & 0 & \cdot & \cdot & \cdot & \cdot & \cdot & \cdot & \cdot & \cdot & \cdot & \cdot & \cdot & \cdot & \cdot & \cdot & \cdot & \cdot \\
30 & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot & \cdot & \cdot \\
11 & \cdot & \cdot & 49 & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot & \cdot \\
39 & \cdot & \cdot & 6 & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot \\
52 & \cdot & \cdot & 31 & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot \\
42 & \cdot & \cdot & 28 & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot \\
\cdot & 41 & 27 & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot \\
41 & \cdot & 23 & \cdot & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot \\
17 & \cdot & \cdot & \cdot & 0 & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot \\
12 & \cdot & \cdot & 49 & \cdot & \cdot & \cdot & \cdot & \cdot & \cdot & \cdot & \cdot & \cdot & \cdot & \cdot & 0 & 0 & \cdot & \cdot & \cdot & \cdot & \cdot & \cdot & \cdot \\
52 & \cdot & \cdot & 6 & \cdot & \cdot & \cdot & \cdot & \cdot & \cdot & \cdot & \cdot & \cdot & \cdot & \cdot & \cdot & 0 & 0 & \cdot & \cdot & \cdot & \cdot & \cdot & \cdot \\
39 & \cdot & \cdot & 35 & \cdot & \cdot & \cdot & \cdot & \cdot & \cdot & \cdot & \cdot & \cdot & \cdot & \cdot & \cdot & \cdot & 0 & 0 & \cdot & \cdot & \cdot & \cdot & \cdot \\
16 & \cdot & \cdot & 19 & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot & \cdot \\
33 & \cdot & \cdot & 48 & \cdot & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot \\
42 & \cdot & \cdot & 2 & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot & \cdot \\
\cdot & 36 & 20 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot \\
27 & \cdot & \cdot & 25 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 \\
22 & \cdot & \cdot & 42 & 1 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0
\end{bmatrix}
$$

Alternatively, the permutation matrix of the code length of 648 is as follows:

$$\begin{bmatrix}
4 & \cdot & \cdot & \cdot & 1 & 0 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot \\
11 & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot & \cdot & \cdot & \cdot & \cdot \\
7 & \cdot & \cdot & 21 & \cdot & \cdot & 0 & 0 & \cdot & \cdot & \cdot & \cdot & \cdot & \cdot & \cdot & \cdot & \cdot & \cdot & \cdot & \cdot & \cdot & \cdot & \cdot & \cdot \\
\cdot & \cdot & \cdot & 1 & \cdot & \cdot & \cdot & 0 & 0 & \cdot & \cdot & \cdot & \cdot & \cdot & \cdot & \cdot & \cdot & \cdot & \cdot & \cdot & \cdot & \cdot & \cdot & \cdot \\
\cdot & \cdot & \cdot & 23 & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot & \cdot \\
\cdot & \cdot & \cdot & 24 & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot \\
25 & \cdot & \cdot & 7 & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot \\
4 & \cdot & \cdot & 1 & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot \\
\cdot & 26 & \cdot & 5 & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot \\
\cdot & \cdot & 18 & 23 & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot \\
\cdot & \cdot & \cdot & 24 & 0 & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot \\
6 & \cdot & \cdot & 10 & \cdot & \cdot & \cdot & \cdot & \cdot & \cdot & \cdot & \cdot & \cdot & \cdot & \cdot & 0 & 0 & \cdot & \cdot & \cdot & \cdot & \cdot & \cdot & \cdot \\
10 & \cdot & \cdot & 8 & \cdot & \cdot & \cdot & \cdot & \cdot & \cdot & \cdot & \cdot & \cdot & \cdot & \cdot & \cdot & 0 & 0 & \cdot & \cdot & \cdot & \cdot & \cdot & \cdot \\
\cdot & 7 & \cdot & 9 & \cdot & \cdot & \cdot & \cdot & \cdot & \cdot & \cdot & \cdot & \cdot & \cdot & \cdot & \cdot & \cdot & 0 & 0 & \cdot & \cdot & \cdot & \cdot & \cdot \\
18 & \cdot & \cdot & 18 & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot & \cdot \\
16 & \cdot & \cdot & 24 & \cdot & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot \\
9 & \cdot & \cdot & 12 & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot & \cdot \\
\cdot & \cdot & 13 & 11 & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot \\
1 & 19 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 \\
23 & \cdot & \cdot & 14 & 1 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0
\end{bmatrix}$$

Figure 14:
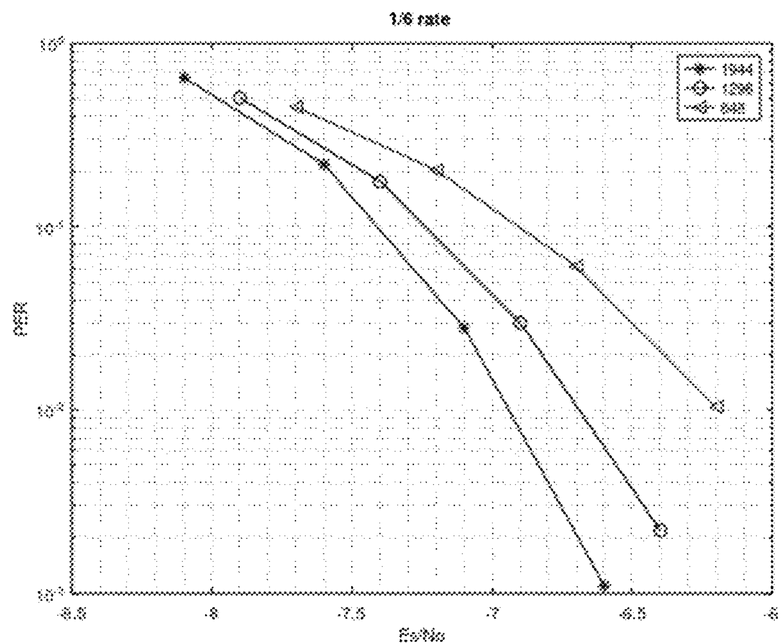
FIG. 14 shows a schematic diagram of the performance corresponding to the three code length permutation matrices at 1/6 bit rate.

FIG. 14 shows the corresponding performance of permutation matrices of the above three code lengths with 1/6 code rate. As shown in the figure, QC-LDPC codes with these three code lengths have excellent performance, for example, the codec that can multiplex LDPC codes with 5/6 code rate has reduced development cost.

For the permutation matrix of 1/4 code rate, the permutation matrix of the code length of 1944 is as follows:

$$\begin{bmatrix}
53 & 79 & \cdot & \cdot & \cdot & \cdot & 1 & 0 & \cdot & \cdot & \cdot & \cdot & \cdot & \cdot & \cdot & \cdot & \cdot & \cdot & \cdot & \cdot & \cdot & \cdot & \cdot & \cdot \\
\cdot & 44 & \cdot & 19 & \cdot & \cdot & \cdot & 0 & 0 & \cdot & \cdot & \cdot & \cdot & \cdot & \cdot & \cdot & \cdot & \cdot & \cdot & \cdot & \cdot & \cdot & \cdot & \cdot \\
60 & \cdot & \cdot & \cdot & \cdot & 43 & \cdot & \cdot & 0 & 0 & \cdot & \cdot & \cdot & \cdot & \cdot & \cdot & \cdot & \cdot & \cdot & \cdot & \cdot & \cdot & \cdot & \cdot \\
55 & 46 & \cdot & \cdot & \cdot & 20 & \cdot & \cdot & \cdot & 0 & 0 & \cdot & \cdot & \cdot & \cdot & \cdot & \cdot & \cdot & \cdot & \cdot & \cdot & \cdot & \cdot & \cdot \\
24 & 7 & 23 & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot \\
66 & \cdot & \cdot & 66 & 15 & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot \\
22 & 17 & \cdot & \cdot & \cdot & 24 & \cdot & \cdot & \cdot & \cdot & \cdot & \cdot & 0 & 0 & \cdot & \cdot & \cdot & \cdot & \cdot & \cdot & \cdot & \cdot & \cdot & \cdot \\
\cdot & 2 & \cdot & \cdot & \cdot & 29 & \cdot & \cdot & \cdot & \cdot & \cdot & \cdot & \cdot & 0 & 0 & \cdot & \cdot & \cdot & \cdot & \cdot & \cdot & \cdot & \cdot & \cdot \\
14 & \cdot & \cdot & \cdot & \cdot & 31 & \cdot & \cdot & \cdot & \cdot & \cdot & \cdot & \cdot & \cdot & 0 & 0 & \cdot & \cdot & \cdot & \cdot & \cdot & \cdot & \cdot & \cdot \\
1 & \cdot & \cdot & \cdot & \cdot & 70 & 0 & \cdot & \cdot & \cdot & \cdot & \cdot & \cdot & \cdot & \cdot & 0 & 0 & \cdot & \cdot & \cdot & \cdot & \cdot & \cdot & \cdot \\
41 & \cdot & \cdot & \cdot & \cdot & 14 & \cdot & \cdot & \cdot & \cdot & \cdot & \cdot & \cdot & \cdot & \cdot & \cdot & 0 & 0 & \cdot & \cdot & \cdot & \cdot & \cdot & \cdot \\
8 & 51 & \cdot & \cdot & \cdot & 18 & \cdot & \cdot & \cdot & \cdot & \cdot & \cdot & \cdot & \cdot & \cdot & \cdot & \cdot & 0 & 0 & \cdot & \cdot & \cdot & \cdot & \cdot \\
26 & \cdot & \cdot & \cdot & \cdot & 78 & \cdot & \cdot & \cdot & \cdot & \cdot & \cdot & \cdot & \cdot & \cdot & \cdot & \cdot & \cdot & 0 & 0 & \cdot & \cdot & \cdot & \cdot \\
18 & \cdot & \cdot & \cdot & \cdot & 44 & \cdot & \cdot & \cdot & \cdot & \cdot & \cdot & \cdot & \cdot & \cdot & \cdot & \cdot & \cdot & \cdot & 0 & 0 & \cdot & \cdot & \cdot \\
\cdot & \cdot & \cdot & 75 & 26 & \cdot & \cdot & \cdot & \cdot & \cdot & \cdot & \cdot & \cdot & \cdot & \cdot & \cdot & \cdot & \cdot & \cdot & \cdot & 0 & 0 & \cdot & \cdot \\
21 & \cdot & 11 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot \\
8 & 74 & \cdot & \cdot & \cdot & 22 & \cdot & \cdot & \cdot & \cdot & \cdot & \cdot & \cdot & \cdot & \cdot & \cdot & \cdot & \cdot & \cdot & \cdot & \cdot & \cdot & 0 & 0 \\
27 & \cdot & 6 & \cdot & \cdot & 23 & 1 & \cdot & \cdot & \cdot & \cdot & \cdot & \cdot & \cdot & \cdot & \cdot & \cdot & \cdot & \cdot & \cdot & \cdot & \cdot & \cdot & 0
\end{bmatrix}$$

The permutation matrix of the code length of 1296 is as follows:

$$\begin{bmatrix}
19 & \cdot & 38 & \cdot & 12 & \cdot & 1 & 0 & \cdot & \cdot & \cdot & \cdot & \cdot & \cdot & \cdot & \cdot & \cdot & \cdot & \cdot & \cdot & \cdot & \cdot & \cdot & \cdot \\
\cdot & \cdot & 17 & \cdot & 0 & \cdot & \cdot & 0 & 0 & \cdot & \cdot & \cdot & \cdot & \cdot & \cdot & \cdot & \cdot & \cdot & \cdot & \cdot & \cdot & \cdot & \cdot & \cdot \\
\cdot & \cdot & 44 & \cdot & 11 & \cdot & \cdot & \cdot & 0 & 0 & \cdot & \cdot & \cdot & \cdot & \cdot & \cdot & \cdot & \cdot & \cdot & \cdot & \cdot & \cdot & \cdot & \cdot \\
24 & \cdot & 46 & \cdot & 5 & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot \\
\cdot & 46 & \cdot & 20 & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot & \cdot \\
45 & \cdot & 11 & 5 & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot \\
\cdot & \cdot & 15 & \cdot & 22 & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot \\
\cdot & 1 & 8 & \cdot & 18 & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot \\
25 & 33 & 48 & \cdot & \cdot & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot \\
\cdot & \cdot & 4 & \cdot & 36 & \cdot & 0 & \cdot & \cdot & \cdot & \cdot & \cdot & \cdot & \cdot & \cdot & 0 & 0 & \cdot & \cdot & \cdot & \cdot & \cdot & \cdot & \cdot \\
\cdot & \cdot & 28 & 51 & 15 & \cdot & \cdot & \cdot & \cdot & \cdot & \cdot & \cdot & \cdot & \cdot & \cdot & \cdot & 0 & 0 & \cdot & \cdot & \cdot & \cdot & \cdot & \cdot \\
\cdot & 30 & 15 & \cdot & 29 & \cdot & \cdot & \cdot & \cdot & \cdot & \cdot & \cdot & \cdot & \cdot & \cdot & \cdot & \cdot & 0 & 0 & \cdot & \cdot & \cdot & \cdot & \cdot \\
\cdot & \cdot & 26 & \cdot & 44 & \cdot & \cdot & \cdot & \cdot & \cdot & \cdot & \cdot & \cdot & \cdot & \cdot & \cdot & \cdot & \cdot & 0 & 0 & \cdot & \cdot & \cdot & \cdot \\
\cdot & \cdot & 0 & \cdot & 35 & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot \\
\cdot & \cdot & 10 & \cdot & 52 & \cdot & \cdot & \cdot & \cdot & \cdot & \cdot & \cdot & \cdot & \cdot & \cdot & \cdot & \cdot & \cdot & \cdot & \cdot & 0 & 0 & \cdot & \cdot \\
\cdot & 21 & 8 & \cdot & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot \\
10 & 19 & \cdot & \cdot & 53 & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 \\
\cdot & 33 & 17 & \cdot & \cdot & 46 & 1 & \cdot & \cdot & \cdot & \cdot & \cdot & \cdot & \cdot & \cdot & \cdot & \cdot & \cdot & \cdot & \cdot & \cdot & \cdot & \cdot & 0
\end{bmatrix}$$

Alternatively, the permutation matrix of the code length of 648 is as follows:

$$
\begin{bmatrix}
26 & \cdot & \cdot & 3 & \cdot & \cdot & 1 & 0 & \cdot & \cdot & \cdot & \cdot & \cdot & \cdot & \cdot & \cdot & \cdot & \cdot & \cdot & \cdot & \cdot & \cdot & \cdot & \cdot \\
19 & \cdot & \cdot & 24 & \cdot & 8 & \cdot & 0 & 0 & \cdot & \cdot & \cdot & \cdot & \cdot & \cdot & \cdot & \cdot & \cdot & \cdot & \cdot & \cdot & \cdot & \cdot & \cdot \\
\cdot & \cdot & \cdot & 13 & \cdot & 1 & \cdot & \cdot & 0 & 0 & \cdot & \cdot & \cdot & \cdot & \cdot & \cdot & \cdot & \cdot & \cdot & \cdot & \cdot & \cdot & \cdot & \cdot \\
1 & \cdot & 14 & \cdot & 4 & \cdot & \cdot & \cdot & \cdot & 0 & 0 & \cdot & \cdot & \cdot & \cdot & \cdot & \cdot & \cdot & \cdot & \cdot & \cdot & \cdot & \cdot & \cdot \\
21 & \cdot & \cdot & 16 & \cdot & 3 & \cdot & \cdot & \cdot & \cdot & 0 & 0 & \cdot & \cdot & \cdot & \cdot & \cdot & \cdot & \cdot & \cdot & \cdot & \cdot & \cdot & \cdot \\
7 & \cdot & \cdot & 9 & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot & \cdot \\
19 & \cdot & \cdot & 19 & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot \\
\cdot & \cdot & \cdot & 11 & \cdot & 4 & \cdot & \cdot & \cdot & \cdot & \cdot & \cdot & \cdot & 0 & 0 & \cdot & \cdot & \cdot & \cdot & \cdot & \cdot & \cdot & \cdot & \cdot \\
\cdot & \cdot & \cdot & 12 & \cdot & 20 & \cdot & \cdot & \cdot & \cdot & \cdot & \cdot & \cdot & \cdot & 0 & 0 & \cdot & \cdot & \cdot & \cdot & \cdot & \cdot & \cdot & \cdot \\
1 & 23 & \cdot & \cdot & \cdot & \cdot & 0 & \cdot & \cdot & \cdot & \cdot & \cdot & \cdot & \cdot & \cdot & 0 & 0 & \cdot & \cdot & \cdot & \cdot & \cdot & \cdot & \cdot \\
25 & \cdot & \cdot & \cdot & 5 & 5 & \cdot & \cdot & \cdot & \cdot & \cdot & \cdot & \cdot & \cdot & \cdot & \cdot & 0 & 0 & \cdot & \cdot & \cdot & \cdot & \cdot & \cdot \\
13 & \cdot & \cdot & \cdot & \cdot & 23 & \cdot & \cdot & \cdot & \cdot & \cdot & \cdot & \cdot & \cdot & \cdot & \cdot & \cdot & 0 & 0 & \cdot & \cdot & \cdot & \cdot & \cdot \\
\cdot & \cdot & \cdot & 1 & \cdot & 19 & \cdot & \cdot & \cdot & \cdot & \cdot & \cdot & \cdot & \cdot & \cdot & \cdot & \cdot & \cdot & 0 & 0 & \cdot & \cdot & \cdot & \cdot \\
5 & \cdot & \cdot & 8 & \cdot & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot \\
\cdot & \cdot & 8 & 20 & \cdot & 6 & \cdot & \cdot & \cdot & \cdot & \cdot & \cdot & \cdot & \cdot & \cdot & \cdot & \cdot & \cdot & \cdot & \cdot & 0 & 0 & \cdot & \cdot \\
12 & \cdot & 24 & 21 & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot \\
0 & \cdot & \cdot & \cdot & \cdot & 14 & \cdot & \cdot & \cdot & \cdot & \cdot & \cdot & \cdot & \cdot & \cdot & \cdot & \cdot & \cdot & \cdot & \cdot & \cdot & \cdot & 0 & 0 \\
3 & 20 & \cdot & 13 & \cdot & \cdot & 1 & \cdot & \cdot & \cdot & \cdot & \cdot & \cdot & \cdot & \cdot & \cdot & \cdot & \cdot & \cdot & \cdot & \cdot & \cdot & \cdot & 0
\end{bmatrix}
$$

Figure 15:
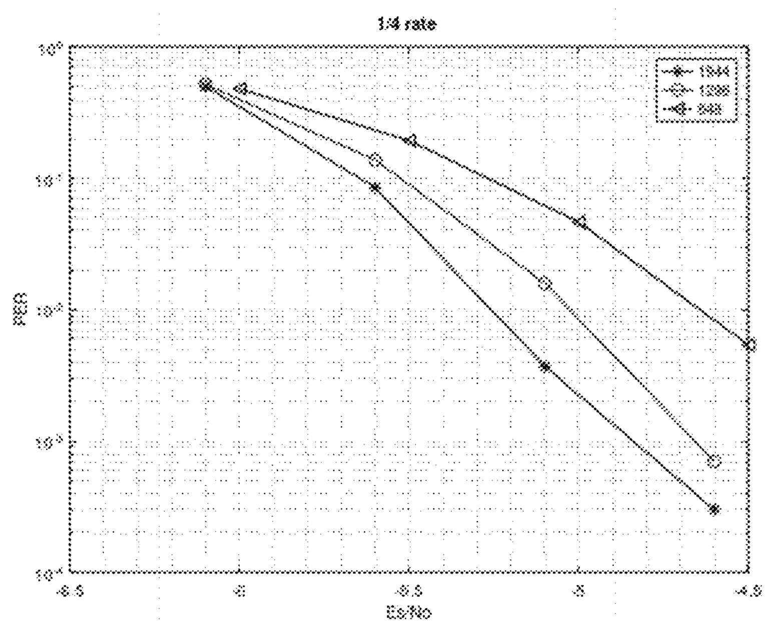
FIG. 15 shows a schematic diagram of the performance corresponding to the three code length permutation matrices at 1/4 bit rate.

FIG. 15 shows the performance of permutation matrices of the above three code lengths for 1/4 code rate. As shown in the figure, QC-LDPC codes with three code lengths have excellent performance. For example, the codec that can multiplex LDPC For the permutation matrix of 1/3 code rate, the permutation matrix of the code length of 1944 is as follows:

$$
\begin{bmatrix}
37 & \cdot & 19 & 46 & 70 & \cdot & \cdot & \cdot & 1 & 0 & \cdot & \cdot & \cdot & \cdot & \cdot & \cdot & \cdot & \cdot & \cdot & \cdot & \cdot & \cdot & \cdot & \cdot \\
49 & \cdot & \cdot & 75 & \cdot & \cdot & \cdot & 0 & \cdot & 0 & 0 & \cdot & \cdot & \cdot & \cdot & \cdot & \cdot & \cdot & \cdot & \cdot & \cdot & \cdot & \cdot & \cdot \\
18 & \cdot & \cdot & 13 & \cdot & \cdot & 8 & \cdot & \cdot & \cdot & 0 & 0 & \cdot & \cdot & \cdot & \cdot & \cdot & \cdot & \cdot & \cdot & \cdot & \cdot & \cdot & \cdot \\
\cdot & 76 & \cdot & 65 & \cdot & \cdot & \cdot & 5 & \cdot & \cdot & \cdot & 0 & 0 & \cdot & \cdot & \cdot & \cdot & \cdot & \cdot & \cdot & \cdot & \cdot & \cdot & \cdot \\
29 & \cdot & \cdot & 27 & \cdot & \cdot & \cdot & 36 & \cdot & \cdot & \cdot & \cdot & 0 & 0 & \cdot & \cdot & \cdot & \cdot & \cdot & \cdot & \cdot & \cdot & \cdot & \cdot \\
46 & 10 & \cdot & 47 & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot \\
20 & \cdot & \cdot & 57 & \cdot & 29 & \cdot & \cdot & \cdot & \cdot & \cdot & \cdot & \cdot & \cdot & 0 & 0 & \cdot & \cdot & \cdot & \cdot & \cdot & \cdot & \cdot & \cdot \\
79 & \cdot & \cdot & \cdot & 60 & 3 & \cdot & \cdot & \cdot & \cdot & \cdot & \cdot & \cdot & \cdot & \cdot & 0 & 0 & \cdot & \cdot & \cdot & \cdot & \cdot & \cdot & \cdot \\
\cdot & \cdot & \cdot & \cdot & 78 & 74 & \cdot & \cdot & \cdot & \cdot & \cdot & \cdot & \cdot & \cdot & \cdot & \cdot & 0 & 0 & \cdot & \cdot & \cdot & \cdot & \cdot & \cdot \\
60 & \cdot & \cdot & 20 & \cdot & \cdot & \cdot & 59 & 0 & \cdot & \cdot & \cdot & \cdot & \cdot & \cdot & \cdot & \cdot & 0 & 0 & \cdot & \cdot & \cdot & \cdot & \cdot \\
69 & \cdot & \cdot & 30 & \cdot & \cdot & \cdot & 16 & \cdot & \cdot & \cdot & \cdot & \cdot & \cdot & \cdot & \cdot & \cdot & \cdot & 0 & 0 & \cdot & \cdot & \cdot & \cdot \\
10 & \cdot & \cdot & 18 & \cdot & \cdot & 24 & \cdot & \cdot & \cdot & \cdot & \cdot & \cdot & \cdot & \cdot & \cdot & \cdot & \cdot & \cdot & 0 & 0 & \cdot & \cdot & \cdot \\
\cdot & \cdot & \cdot & 31 & 59 & \cdot & 54 & \cdot & \cdot & \cdot & \cdot & \cdot & \cdot & \cdot & \cdot & \cdot & \cdot & \cdot & \cdot & \cdot & 0 & 0 & \cdot & \cdot \\
33 & 57 & \cdot & 76 & \cdot & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot \\
56 & \cdot & \cdot & 50 & \cdot & 1 & \cdot & \cdot & \cdot & \cdot & \cdot & \cdot & \cdot & \cdot & \cdot & \cdot & \cdot & \cdot & \cdot & \cdot & \cdot & \cdot & 0 & 0 \\
65 & 53 & \cdot & 24 & \cdot & \cdot & \cdot & \cdot & 1 & \cdot & \cdot & \cdot & \cdot & \cdot & \cdot & \cdot & \cdot & \cdot & \cdot & \cdot & \cdot & \cdot & \cdot & 0
\end{bmatrix}
$$

The permutation matrix of the code length of 1296 is as follows:

$$
\begin{bmatrix}
47 & \cdot & \cdot & 14 & 43 & \cdot & \cdot & \cdot & 1 & 0 & \cdot & \cdot & \cdot & \cdot & \cdot & \cdot & \cdot & \cdot & \cdot & \cdot & \cdot & \cdot & \cdot & \cdot \\
41 & \cdot & \cdot & \cdot & 4 & \cdot & \cdot & 30 & \cdot & 0 & 0 & \cdot & \cdot & \cdot & \cdot & \cdot & \cdot & \cdot & \cdot & \cdot & \cdot & \cdot & \cdot & \cdot \\
11 & \cdot & \cdot & 4 & \cdot & 24 & \cdot & 46 & \cdot & \cdot & 0 & 0 & \cdot & \cdot & \cdot & \cdot & \cdot & \cdot & \cdot & \cdot & \cdot & \cdot & \cdot & \cdot \\
41 & \cdot & 5 & \cdot & \cdot & \cdot & \cdot & 5 & \cdot & \cdot & \cdot & 0 & 0 & \cdot & \cdot & \cdot & \cdot & \cdot & \cdot & \cdot & \cdot & \cdot & \cdot & \cdot \\
42 & 26 & 12 & \cdot & 24 & \cdot & \cdot & \cdot & \cdot & \cdot & \cdot & \cdot & 0 & 0 & \cdot & \cdot & \cdot & \cdot & \cdot & \cdot & \cdot & \cdot & \cdot & \cdot \\
31 & \cdot & \cdot & 50 & 2 & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot \\
19 & \cdot & \cdot & 46 & 37 & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot \\
52 & 17 & \cdot & 22 & 47 & \cdot & \cdot & \cdot & \cdot & \cdot & \cdot & \cdot & \cdot & \cdot & \cdot & 0 & 0 & \cdot & \cdot & \cdot & \cdot & \cdot & \cdot & \cdot \\
0 & 50 & \cdot & \cdot & \cdot & 21 & \cdot & \cdot & \cdot & \cdot & \cdot & \cdot & \cdot & \cdot & \cdot & \cdot & 0 & 0 & \cdot & \cdot & \cdot & \cdot & \cdot & \cdot \\
23 & \cdot & 28 & \cdot & \cdot & 9 & \cdot & \cdot & 0 & \cdot & \cdot & \cdot & \cdot & \cdot & \cdot & \cdot & \cdot & 0 & 0 & \cdot & \cdot & \cdot & \cdot & \cdot \\
45 & \cdot & \cdot & 37 & 44 & \cdot & \cdot & \cdot & \cdot & \cdot & \cdot & \cdot & \cdot & \cdot & \cdot & \cdot & \cdot & \cdot & 0 & 0 & \cdot & \cdot & \cdot & \cdot \\
27 & \cdot & \cdot & 34 & 37 & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot \\
4 & \cdot & \cdot & 0 & \cdot & \cdot & \cdot & 4 & \cdot & \cdot & \cdot & \cdot & \cdot & \cdot & \cdot & \cdot & \cdot & \cdot & \cdot & \cdot & 0 & 0 & \cdot & \cdot \\
6 & \cdot & \cdot & 5 & 32 & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot \\
49 & \cdot & \cdot & \cdot & \cdot & 12 & \cdot & 52 & \cdot & \cdot & \cdot & \cdot & \cdot & \cdot & \cdot & \cdot & \cdot & \cdot & \cdot & \cdot & \cdot & \cdot & 0 & 0 \\
\cdot & \cdot & \cdot & 15 & \cdot & \cdot & 46 & 22 & 1 & \cdot & \cdot & \cdot & \cdot & \cdot & \cdot & \cdot & \cdot & \cdot & \cdot & \cdot & \cdot & \cdot & \cdot & 0
\end{bmatrix}
$$

Alternatively, the permutation matrix of the code length of 648 is as follows:

$$\begin{bmatrix}
\cdot & 18 & \cdot & 3 & 25 & \cdot & \cdot & \cdot & 1 & 0 & \cdot & \cdot & \cdot & \cdot & \cdot & \cdot & \cdot & \cdot & \cdot & \cdot & \cdot & \cdot & \cdot & \cdot \\
\cdot & 23 & \cdot & \cdot & 24 & \cdot & \cdot & 22 & \cdot & 0 & 0 & \cdot & \cdot & \cdot & \cdot & \cdot & \cdot & \cdot & \cdot & \cdot & \cdot & \cdot & \cdot & \cdot \\
\cdot & 18 & \cdot & 26 & \cdot & \cdot & \cdot & 1 & \cdot & \cdot & 0 & 0 & \cdot & \cdot & \cdot & \cdot & \cdot & \cdot & \cdot & \cdot & \cdot & \cdot & \cdot & \cdot \\
\cdot & 25 & 0 & \cdot & \cdot & 23 & 22 & \cdot & \cdot & \cdot & \cdot & 0 & 0 & \cdot & \cdot & \cdot & \cdot & \cdot & \cdot & \cdot & \cdot & \cdot & \cdot & \cdot \\
13 & 5 & \cdot & 8 & \cdot & \cdot & \cdot & 16 & \cdot & \cdot & \cdot & \cdot & 0 & 0 & \cdot & \cdot & \cdot & \cdot & \cdot & \cdot & \cdot & \cdot & \cdot & \cdot \\
\cdot & 17 & 5 & 13 & 22 & \cdot & \cdot & \cdot & \cdot & \cdot & \cdot & \cdot & \cdot & 0 & 0 & \cdot & \cdot & \cdot & \cdot & \cdot & \cdot & \cdot & \cdot & \cdot \\
12 & 24 & \cdot & 15 & \cdot & \cdot & \cdot & \cdot & \cdot & \cdot & \cdot & \cdot & \cdot & \cdot & 0 & 0 & \cdot & \cdot & \cdot & \cdot & \cdot & \cdot & \cdot & \cdot \\
\cdot & 26 & \cdot & 23 & 9 & \cdot & \cdot & \cdot & \cdot & \cdot & \cdot & \cdot & \cdot & \cdot & \cdot & 0 & 0 & \cdot & \cdot & \cdot & \cdot & \cdot & \cdot & \cdot \\
\cdot & 7 & \cdot & 17 & \cdot & \cdot & 20 & \cdot & \cdot & \cdot & \cdot & \cdot & \cdot & \cdot & \cdot & \cdot & 0 & 0 & \cdot & \cdot & \cdot & \cdot & \cdot & \cdot \\
\cdot & 12 & \cdot & 6 & \cdot & \cdot & \cdot & 10 & 0 & \cdot & \cdot & \cdot & \cdot & \cdot & \cdot & \cdot & \cdot & 0 & 0 & \cdot & \cdot & \cdot & \cdot & \cdot \\
\cdot & 15 & 16 & 3 & \cdot & \cdot & \cdot & \cdot & \cdot & \cdot & \cdot & \cdot & \cdot & \cdot & \cdot & \cdot & \cdot & \cdot & 0 & 0 & \cdot & \cdot & \cdot & \cdot \\
\cdot & 23 & \cdot & 22 & \cdot & \cdot & \cdot & 20 & \cdot & \cdot & \cdot & \cdot & \cdot & \cdot & \cdot & \cdot & \cdot & \cdot & \cdot & 0 & 0 & \cdot & \cdot & \cdot \\
\cdot & 14 & \cdot & 18 & \cdot & \cdot & \cdot & 19 & \cdot & \cdot & \cdot & \cdot & \cdot & \cdot & \cdot & \cdot & \cdot & \cdot & \cdot & \cdot & 0 & 0 & \cdot & \cdot \\
7 & 22 & \cdot & \cdot & 7 & \cdot & \cdot & \cdot & \cdot & \cdot & \cdot & \cdot & \cdot & \cdot & \cdot & \cdot & \cdot & \cdot & \cdot & \cdot & \cdot & 0 & 0 & \cdot \\
21 & 23 & \cdot & \cdot & \cdot & 20 & \cdot & \cdot & \cdot & \cdot & \cdot & \cdot & \cdot & \cdot & \cdot & \cdot & \cdot & \cdot & \cdot & \cdot & \cdot & \cdot & 0 & 0 \\
\cdot & 2 & \cdot & 11 & 18 & \cdot & \cdot & \cdot & 1 & \cdot & \cdot & \cdot & \cdot & \cdot & \cdot & \cdot & \cdot & \cdot & \cdot & \cdot & \cdot & \cdot & \cdot & 0
\end{bmatrix}$$

Figures 16, 17:
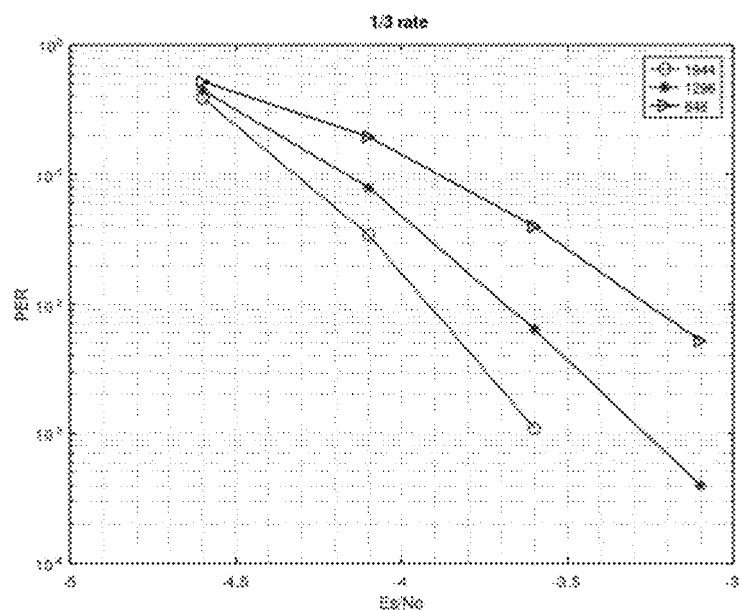
FIG. 16 shows a schematic diagram of the performance corresponding to the three code length permutation matrices at 1/3 bit rate.
FIG. 17 shows a schematic diagram of a treatment device provided according to at least one embodiment of the present disclosure.

FIG. 16 shows the performance of permutation matrices of the above three code lengths for 1/3 code rate. As shown in the figure, QC-LDPC codes with three code lengths have excellent performance. For example, the codec that can multiplex LDPC codes with 2/3 code rate has reduced development cost.

At least one embodiment of the present disclosure provides a channel coding method, which includes: channel-encoding or channel-decoding a code stream by using a generating matrix or a check matrix of QC-LDPC codes, wherein the code rate of the generating matrix or the check matrix is 1/6, 1/4 or 1/3. Referring to FIG. 1, the code stream obtained by source-encoding is channel-encoded to obtain the code stream to be further modulated, or the demodulated code stream is channel-decoded to obtain the code stream to be further source-decoded. For example, these code streams include object data and/or control signaling. In other words, at least one embodiment of the present disclosure correspondingly provides a channel-encoding method; at least one embodiment of the present disclosure correspondingly provides a channel-decoding method. For example, this method can be used in a wireless communication system, which can include transceiver devices that communicate with each other. These transceiver devices may include a base station, a UE, etc. (for example, for a mobile communication system), or include access devices (for example, wireless routers) and client terminals (for example, mobile phones, computers, etc.), and these transceiver devices can perform the above-mentioned channel-encoding method and/or channel-decoding method. For example, this method uses the check matrix of QC-LDPC code obtained by the method of constructing the check matrix as described in any embodiment to channel-encode or channel-decode the code stream.

At least one embodiment of the present disclosure also provides a communication method, which includes using the above channel coding method to perform channel-encoding or channel-decoding.

At least one embodiment of the present disclosure also provides a processing device for channel encoding and decoding, and the processing device includes: a receiving unit and a processing unit. The receiving unit is configured to receive the code stream; the processing unit is configured to channel-encode or channel-decode the code stream by using the generating matrix or check matrix of QC-LDPC code, wherein the code rate of the generating matrix or check matrix is 1/6, 1/4 or 1/3. The receiving unit and the processing unit may be implemented, for example, by software, hardware, firmware or any combination of these ways, for example, by analog/digital circuits. Referring to FIG. 1, channel-encoding is performed on the code stream obtained by source-encoding to obtain the code stream to be further modulated, or perform channel-decoding on the demodulated code stream to obtain the code stream to be further source-decoded; for example, these code streams include object data and/or control signaling. In other words, at least one embodiment of the present disclosure correspondingly provides a channel-encoding device; at least one embodiment of the present disclosure correspondingly provides a channel-decoding device. For example, the processing device for channel encoding and decoding can be used in a wireless communication system, which may include transceiver devices that communicate with each other. These transceiver devices may include a base station, a UE, etc. (for example, for a mobile communication system), or may include access devices (for example, wireless routers) and client terminals (for example, mobile phones, computers, etc.), and can execute the above-mentioned channel-encoding devices and/or channel-decoding devices.

At least one embodiment of the present disclosure also provides a communication device, which includes the above channel encoding and decoding device to perform channel-encoding or channel-decoding; according to needs, the communication device may further include a source-decoding device, such as a radio frequency device.

For example, the channel coding method and device may be used in, for example, 5G NR, WiFi, DVB and optical communication systems, which are not limited in the embodiments of the present disclosure.

For example, the number of columns corresponding to systematic bits in the permutation matrix corresponding to the generating matrix or the check matrix is Ns, and the number of rows in the permutation matrix is Nrow.

For 1/6 code rate, Ns=4, and Nrow=20;

For 1/4 code rate, Ns=6, and Nrow=18; and

For 1/3 code rate, Ns=8, and Nrow=16.

For example, the total weight range of the permutation matrix is from 79 to 88;

For 1/6 code rate, the row weight of each row in the base matrix is 5 or 4;

For 1/4 code rate, the row weight of each row in the base matrix is 5;

For 1/3 code rate, the row weight of each row in the base matrix is 6 or 5.

Further, the above exemplary permutation matrix may be used.

At least one embodiment of the present disclosure also provides a processing device for executing the above-mentioned base matrix construction method, the permutation matrix construction method or the coding method. For example, FIG. 17 shows a schematic diagram of the processing device provided according to at least one embodiment of the present disclosure.

As shown in FIG. 17, the processing device 600 of an instruction pipeline includes a processing unit 610 and a memory 620, on which one or more computer program modules 621 are stored, and each computer program module includes computer executable instructions; when the computer program module 621 is executed by the processing unit 610, it is used to execute the base matrix construction method, the permutation matrix construction method or the coding method of any of the above embodiments, and the base matrix construction method, the permutation matrix construction method or the coding method of any of the above embodiments are implemented.

At least one embodiment of the present disclosure provides a non-instantaneous readable storage medium, on which computer instructions are stored, which, when executed by a processor, are used to execute the base matrix construction method, the permutation matrix construction method or the coding method of any of the above embodiments, and the base matrix construction method, the permutation matrix construction method or the coding method of any of the above embodiments are implemented.

For example, the non-instantaneous readable storage medium is implemented as a memory, such as a volatile memory and/or a nonvolatile memory. The memory in the above embodiment may be volatile memory, and for example, may include Random Access Memory (RAM) and/or cache. The non-volatile memory may include, for example, Read-Only Memory (ROM), hard disk, Erasable Programmable Read-Only Memory (EPROM), portable compact disk Read-Only Memory (CD-ROM), USB memory, flash memory, etc. The memory can also store various applications and data, and various data used and/or generated by the applications.

At least one embodiment of the present disclosure provides an electronic device, which includes a processing device for executing the above-mentioned base matrix construction method, the permutation matrix construction method or the coding method according to any embodiment, and the above-mentioned base matrix construction method, the permutation matrix construction method or the coding method are implemented.

For example, in at least one example, the electronic device is a processor. For example, the processor may be a single-core processor or a multi-core processor, and the processor core includes the processing device of the above instruction pipeline; for example, the processor may be a scalar processor or a superscalar processor, which is not limited in this embodiments of the present disclosure.

Figure 18:
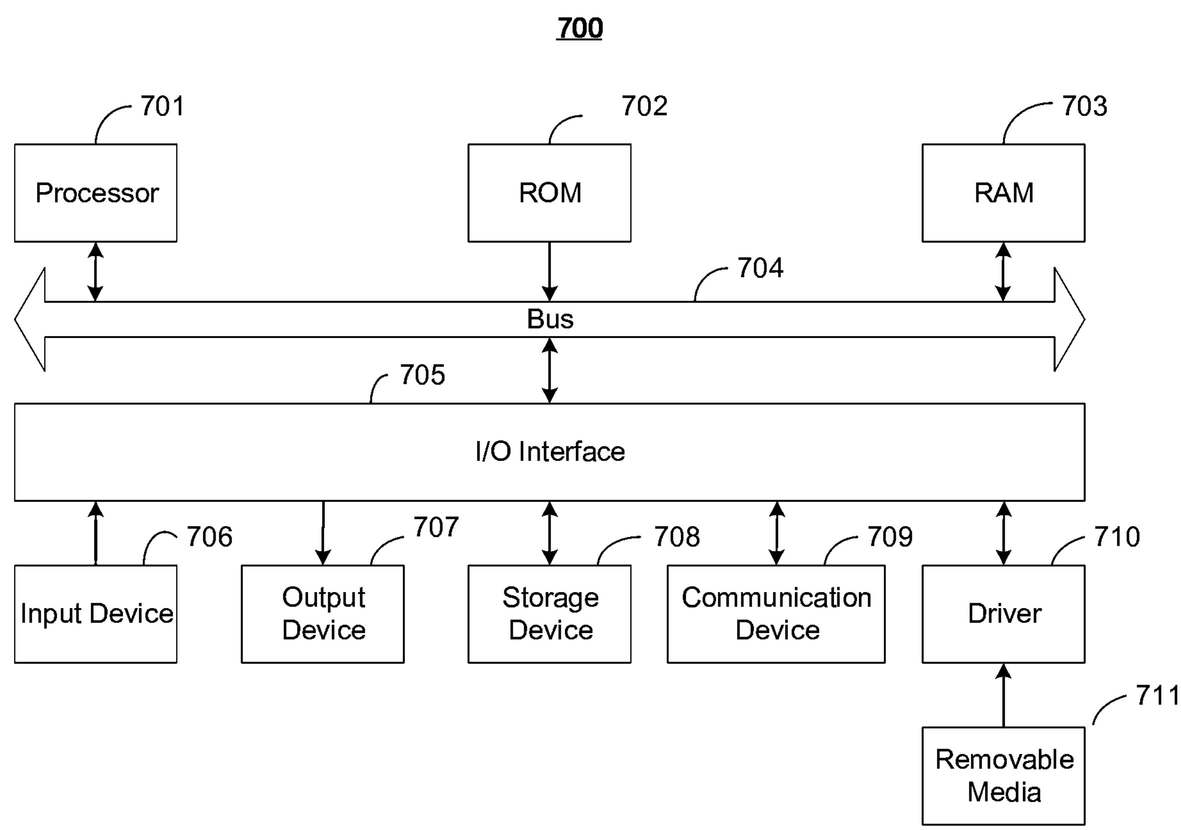
FIG. 18 is a schematic block diagram of an electronic device provided by at least one embodiment of the present disclosure.

FIG. 18 is a schematic block diagram of an electronic device 700 provided by at least one embodiment of the present disclosure. The electronic devices in the disclosed embodiment may include, but are not limited to, mobile terminals such as wireless communication base stations, wireless access devices (e.g., access point devices), wireless routers, mobile phones, notebook computers, digital broadcast receivers, PDAs (Personal Digital Assistants), PADs (tablet computers), PMPs (portable multimedia players), vehicle-mounted terminals (e.g., vehicle-mounted navigation terminals), etc. and fixed terminals such as digital TVs, desktop computers, etc. The electronic device 700 shown in FIG. 18 is only an example, and should not bring any limitation to the functions and application scope of the embodiments of the present disclosure.

For example, as shown in FIG. 18, in some examples, the electronic device 700 includes a processor (e.g., Central Processing Unit) 701, which can perform various appropriate actions and processes according to a program stored in a Read-Only Memory (ROM) 702 or a program loaded from a storage device 708 into a Random Access Memory (RAM) 703, for executing the base matrix construction method, the permutation matrix construction method, the coding method, etc. of any of the above embodiments to realize the above. The RAM 703 also stores various programs and data required for the operation of the computer system. The processor 701, ROM 702 and RAM 703 are connected by a bus 704. Input/output (I/O) interface 705 is also connected to bus 704.

For example, the following components may be connected to the I/O interface 705: an input device 706 including, for example, a touch screen, a touch panel, a keyboard, a mouse, a camera, a microphone, an accelerometer, a gyroscope, and the like; may include an output device 707 such as a Liquid Crystal Display (LCD), a speaker, a vibrator, etc.; may include a storage device 708 including a magnetic tape, a hard disk, etc.; may also include, for example, a communication device 709 including a network interface card such as a LAN card, a modem, etc. The communication device 709 may allow the electronic device 700 to perform wireless or wired communication with other devices to exchange data and perform communication processing via a network such as the Internet. A driver 710 is also connected to the I/O interface 705 as needed. A removable media 711, such as magnetic disk, optical disk, magneto-optical disk, semiconductor memory, etc., is installed on the driver 710 as needed, so that the computer program read from it can be installed into the storage device 708 as needed. Although FIG. 18 shows an electronic device 700 including various devices, it should be understood that it is not required to implement or include all the devices shown. More or fewer devices may alternatively be implemented or included.

For example, the electronic device 700 may further include a peripheral interface (not shown) and the like. The peripheral interface may be various types of interfaces, such as a USB interface, a lighting interface, etc. The communication device 709 may communicate with a network and other devices through wireless communication, and the network is, for example, an internet, an intranet and/or a wireless network such as a cellular telephone network, a wireless Local Area Network (LAN) and/or a Metropolitan Area Network (MAN). Wireless communication may use any of a variety of communication standards, protocols and technologies, including but not limited to Global System For Mobile Communication (GSM), enhanced data GSM environment (EDGE), Wideband Code Division Multiple Access (W-CDMA), Code Division Multiple Access (CDMA), Time Division Multiple Access (TDMA), Bluetooth, Wi-Fi (based on IEEE 802.11a, IEEE 802.11b, IEEE 802.11g and/or IEEE 800, for example), Voice over Internet Protocol (VoIP), Wi-MAX, protocols for e-mail, instant messaging and/or Short Message Service (SMS), or any other suitable communication protocol.

For example, the electronic device 700 may be any device such as a wireless communication base station, a wireless access device (such as an access point device), a wireless router, a mobile phone, a tablet computer, a notebook computer, an e-book, a game machine, a TV set, a digital photo frame, a navigator, etc., or any combination of data processing devices and hardware, which are not limited in the embodiments of the present disclosure.

For this disclosure, the following points need to be explained:

(1) The drawings of the embodiments of the present disclosure only relate to the structures related in the embodiments of the present disclosure, and other structures may refer to the general design.

(2) Without conflict, the embodiments of the present disclosure and the features in the embodiments may be combined with each other to obtain a new embodiment.

The above is only an exemplary embodiment of the present disclosure, and it is not intended to limit the scope of protection of the present disclosure, and the scope of protection is determined by the appended claims.

What is claimed is:

1. A method of constructing a permutation matrix for Quasi-Cyclic Low Density Parity Check (QC-LDPC) codes, comprising:

obtaining a base matrix used for the permutation matrix;

lifting the base matrix to obtain the permutation matrix, which comprises:

obtaining a protograph of the base matrix, including macro-cycles; and obtaining respective macro-cycles in the protograph, and for the respective macro-cycles in the protograph, determining a size of a short cycle corresponding to the macro-cycle in a Tanner graph of a check matrix corresponding to the permutation matrix by an equivalent cyclic shift (ECS) of the macro-cycle, and determining whether at least one cyclic shift in the macro-cycle needs to be set according to the size of the short cycle; and channel-encoding or channel-decoding a code stream by using the check matrix, wherein the lifting the base matrix to obtain the permutation matrix further comprises:

obtaining ECSs of the macro-cycles, wherein it is assumed that the macro-cycle of size 2*L on the protograph is composed of cyclic shifts $\{P(i_0,j_0), P(i_0,j_1), P(i_1,j_1), P(i_1,j_2), \ldots, P(i_{(L-1)},j_L)\}$, wherein $j_L=j_0$, j indicates a column of the permutation matrix, L is a positive integer, then the equivalent cyclic shifts, ECSs, are determined by the following:

$$ECS = \sum_{l=0}^{L-1}(-P(i_l, j_l) + P(i_l, j_{l+1})).$$

2. The method according to claim 1, wherein the lifting the base matrix to obtain the permutation matrix further comprises:

enabling ECSs of all macro-cycles in the protograph to meet requirements of the Tanner graph of the check matrix on a minimum short cycle and requirements on external information freedom degree, wherein the external information freedom degree is a number of check nodes with only one edge connected to a cycle in the Tanner graph.

3. The method according to claim 1, wherein the obtaining the respective macro-cycles in the protograph, and for the respective macro-cycles in the protograph, the determining the size of the short cycle corresponding to the macro-cycle in the Tanner graph of the check matrix corresponding to the permutation matrix by the equivalent cyclic shift, ECS, of the macro-cycle, and the determining whether at least one cyclic shift in the macro-cycle needs to be set according to the size of the short cycle comprises:

taking a variable node in the protograph of the base matrix as a root node to expand into a tree, and searching the tree to check whether there is the macro-cycle corresponding to the tree.

4. The method according to claim 3, wherein the taking respective variable node in the protograph of the base matrix as the root node to expand into the tree, and the searching the tree to check whether there is the macro-cycle corresponding to the tree comprises:

according to the base matrix, establishing variable node information and check node information of the protograph of the base matrix;

based on the variable node information and the check node information, establishing a transfer information combination used for transmission among nodes during the tree search; and setting an initial value of the transfer information combination, and recursively calling the tree to perform the tree search to check whether there is the macro-cycle corresponding to the tree.

5. The method according to claim 4, wherein each of the variable node information and the check node information includes a node index, a number of neighbor nodes, and an index array of neighbor nodes.

6. The method according to claim 4, wherein the transfer information combination comprises a root node index, a parent node index, a current search depth, and a cycle node index, wherein the cycle node index is used to record the node indexes of all nodes that constitute a cycle.

7. The method according to claim 6, wherein the transfer information combination further comprises a minimum cycle threshold of the Tanner graph of the check matrix and a minimum threshold of the external information freedom degree of the Tanner graph of the check matrix.

8. The method according to claim 4, wherein the obtaining the respective macro-cycles in the protograph, and for the respective macro-cycles in the protograph, the determining the size of the short cycle corresponding to the macro-cycle in the Tanner graph of the check matrix corresponding to the permutation matrix by the equivalent cyclic shift, ECS, of the macro-cycle, and the determining whether at least one cyclic shift in the macro-cycle needs to be set according to the size of the short cycle further comprises:

in the process of the tree search, for respective currently searched variable nodes in the tree:

if the current search depth has met the minimum cycle threshold of the Tanner graph of the check matrix, stopping the tree search and returning a success flag;

if the current search depth does not reach the minimum cycle threshold, but the first macro-cycle has been found in the tree search, then using the equivalent cyclic shift, ECS, of the first macro-cycle to check or allocate respective cyclic shifts constituting the first macro-cycle, so that the short cycle on the Tanner graph of the check matrix is greater than or equal to the minimum cycle threshold; or if the current search depth does not reach the minimum cycle threshold, and any macro-cycle is found in the tree search, then continuing the tree search.

9. The method according to claim 8, wherein, in the process of the tree search, it is further checked whether there is a deadlock for the respective currently searched variable nodes in the tree, and if the deadlock occurs, the tree search is stopped.

10. The method according to claim 8, wherein the checking or allocating respective cyclic shifts constituting the first macro-cycle by using the equivalent cyclic shift, ECS, of the first macro-cycle comprises:

if a certain cyclic shift constituting the first macro-cycle has not been allocated, then randomly selecting a value within [0, Z−1], and if the ECS of the first macro-cycle meets the minimum cycle threshold, stopping the tree search and returning a success flag; and if all the cyclic shifts constituting the first macro-cycle have been allocated, but the ECS of the first macro-cycle does not meet the minimum cycle threshold, then selecting a cyclic shift that can be changed in the first macro-cycle and incrementing it by 1 and performing modulo Z to obtain a new cyclic shift, and then starting a new search from the root node, where Z is a lifting factor, and is a positive integer.

11. The method according to claim 10, wherein the selecting the cyclic shift that can be changed in the first macro-cycle and incrementing it by 1 and performing modulo Z to obtain a new cyclic shift comprises:

selecting the cyclic shift with the largest search depth from the cyclic shifts that can be changed in the first macro-cycle and incrementing it by 1 and performing modulo Z to obtain a new cyclic shift.

12. The method according to claim 4, wherein the obtaining the respective macro-cycles in the protograph, and for the respective macro-cycles in the protograph, the determining the size of a short cycle corresponding to the macro-cycle in the Tanner graph of the check matrix corresponding to the permutation matrix by the equivalent cyclic shift ECS of the macro-cycle, and the determining whether at least one cyclic shift in the macro-cycle needs to be set according to the size of the short cycle further comprises:

in the process of the tree search, for respective currently searched check nodes in the tree:

if the current search depth has met the minimum cycle threshold of the Tanner graph of the check matrix, stopping the tree search and returning a success flag;

if the current search depth does not reach the minimum cycle threshold, but the second macro-cycle has been found in the tree search, then using the equivalent cyclic shift, ECS, of the second macro-cycle to check or allocate the cyclic shifts constituting the second macro-cycle, so that the short cycle on the Tanner graph of the check matrix is greater than or equal to the minimum cycle threshold; or if the current search depth does not reach the minimum cycle threshold, and any macro-cycle is found in the tree search, then continuing the tree search.

13. The method according to claim 12, wherein in the process of the tree search, checking whether there is a deadlock for the respective currently searched check nodes in the tree, and if the deadlock occurs, stopping the tree search.

14. The method according to claim 1, wherein a code rate of the permutation matrix is 1/6, 1/4 or 1/3.

15. The method according to claim 14, wherein a total weight range of the base matrix is from 79 to 88;

for 1/6 code rate, a row weight of each row in the base matrix is equal to 5 or 4;

for 1/4 code rate, the row weight of each row in the base matrix is equal to 5; and for 1/3 code rate, the row weight of each row in the base matrix is equal to 6 or 5.

16. A method of constructing a check matrix of Quasi-Cyclic Low Density Parity Check (QC-LDPC) codes, comprising:

obtaining the permutation matrix according to a method of constructing a permutation matrix for QC-LDPC codes; and obtaining the check matrix from the permutation matrix, wherein the method of constructing a permutation matrix for QC-LDPC codes comprises:

obtaining a base matrix used for the permutation matrix;

lifting the base matrix to obtain the permutation matrix, which comprises:

obtaining a protograph of the base matrix including macro-cycles; and obtaining respective macro-cycles in the protograph, and for the respective macro-cycles in the protograph, determining a size of a short cycle corresponding to the macro-cycle in a Tanner graph of a check matrix corresponding to the permutation matrix by an equivalent cyclic shift (ECS) of the macro-cycle, and determining whether at least one cyclic shift in the macro-cycle needs to be set according to the size of the short cycle; and channel-encoding or channel-decoding a code stream by using the check matrix, wherein the lifting the base matrix to obtain the permutation matrix further comprises:

obtaining ECSs of the macro-cycles, wherein it is assumed that the macro-cycle of size 2*L on the protograph is composed of cyclic shifts $\{P(i_0,j_0), P(i_0,j_1), P(i_1,j_1), P(i_1,j_2), \ldots, P(i_{(L-1)},j_L)\}$, wherein $j_L=j_0$, j indicates a column of the permutation matrix, L is a positive integer, then the equivalent cyclic shifts, ECSs, are determined by the following:

$$ECS = \sum_{l=0}^{L-1} (-P(i_l, j_l) + P(i_l, j_{l+1})).$$

17. A processing device, comprising:

a processing unit; and a memory, on which one or more computer program modules are stored;

wherein when the one or more computer program modules are configured to be executed by the processing unit, a method of constructing a permutation matrix for Quasi-Cyclic Low Density Parity Check (QC-LDPC) codes or a method of constructing a check matrix of QC-LDPC codes is implemented, and a method of constructing a check matrix of QC-LDPC codes, comprising:

obtaining the permutation matrix according to the method of constructing a permutation matrix for QC-LDPC codes;

obtaining the check matrix from the permutation matrix; and channel-encoding or channel-decoding a code stream by using the check matrix, wherein the method of constructing a permutation matrix for QC-LDPC codes, comprising:

obtaining a base matrix used for the permutation matrix; and lifting the base matrix to obtain the permutation matrix, which comprises:

obtaining a protograph of the base matrix including macro-cycles; and obtaining respective macro-cycles in the protograph, and for the respective macro-cycles in the protograph, determining a size of a short cycle corresponding to the macro-cycle in a Tanner graph of the check matrix corresponding to the permutation matrix by an equivalent cyclic shift (ECS) of the macro-cycle, and determining whether at least one cyclic shift in the macro-cycle needs to be set according to the size of the short cycle, wherein the lifting the base matrix to obtain the permutation matrix further comprises:

obtaining ECSs of the macro-cycles, wherein it is assumed that the macro-cycle of size 2*L on the protograph is composed of cyclic shifts $\{P(i_0,j_0), P(i_0,j_1), P(i_1,j_1), P(i_1,j_2), \ldots, P(i_{(L-1)},j_L)\}$, wherein $j_L=j_0$, j indicates a column of the permutation matrix, L is a positive integer, then the equivalent cyclic shifts, ECSs, are determined by the following:

$$ECS = \sum_{l=0}^{L-1} (-P(i_l, j_l) + P(i_l, j_{l+1})).$$

* * * * *